(12) United States Patent
Loubet et al.

(10) Patent No.: US 10,367,077 B1
(45) Date of Patent: Jul. 30, 2019

(54) WRAP AROUND CONTACT USING SACRIFICIAL MANDREL

(71) Applicant: International Business Machines Corporation, Armonk, NY (US)

(72) Inventors: Nicolas Loubet, Guilderland, NY (US); Adra Carr, Albany, NY (US); Kangguo Cheng, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/964,573

(22) Filed: Apr. 27, 2018

(51) Int. Cl.
*H01L 29/66* (2006.01)
*H01L 21/768* (2006.01)
*H01L 27/088* (2006.01)

(52) U.S. Cl.
CPC .... *H01L 29/6656* (2013.01); *H01L 21/76895* (2013.01); *H01L 27/0886* (2013.01); *H01L 29/66545* (2013.01); *H01L 29/66795* (2013.01)

(58) Field of Classification Search
None
See application file for complete search history.

(56) References Cited

U.S. PATENT DOCUMENTS

| | | | |
|---|---|---|---|
| 9,159,794 B2 | 10/2015 | Yu et al. | |
| 9,318,581 B1 | 4/2016 | Guo et al. | |
| 9,397,003 B1 | 7/2016 | Niimi et al. | |
| 9,397,197 B1 | 7/2016 | Guo et al. | |
| 9,704,744 B2 | 7/2017 | Leib et al. | |
| 9,805,989 B1 | 10/2017 | Adusumilli et al. | |
| 9,847,390 B1 | 12/2017 | Xie et al. | |
| 2011/0147840 A1 | 6/2011 | Cea et al. | |
| 2013/0001705 A1 | 1/2013 | Su et al. | |
| 2013/0071980 A1 | 3/2013 | Lin et al. | |
| 2013/0092988 A1 | 4/2013 | Uozumi | |

(Continued)

FOREIGN PATENT DOCUMENTS

WO 20150147842 10/2015

OTHER PUBLICATIONS

Chew et al., "Ultralow Resistive Wrap Around Contact to Scaled FinFET Devices by using ALD-Ti Contact Metal" In IEEE International Interconnect Technology Conference (IITC 2017, pp. 1-3 2017.

(Continued)

*Primary Examiner* — J. E. Schoenholtz
(74) *Attorney, Agent, or Firm* — Fleit Gibbons Gutman Bongini Bianco PL; Thomas S. Grzesik

(57) ABSTRACT

A semiconductor structure and a method for fabricating the same. The semiconductor structure includes a plurality of unmerged fin structures each in contact with their own source/drain. The semiconductor structure further includes a contact layer formed on sidewalls and a top surface of each source/drain. The method includes at least the following operations. At least one mandrel layer is formed adjacent to at least one fin structure. The at least one fin structure and at least one source/drain is epitaxially grown in contact with the at least one fin structure and the at least one mandrel layer. The at least one mandrel layer is removed after the at least one source/drain has been epitaxially grown. At least one contact layer is formed in contact with sidewalls and a top surface of the at least one source/drain.

19 Claims, 21 Drawing Sheets

(56) References Cited

U.S. PATENT DOCUMENTS

| | | | |
|---|---|---|---|
| 2013/0161756 A1* | 6/2013 | Glass | H01L 29/66545 |
| | | | 257/369 |
| 2013/0187228 A1* | 7/2013 | Xie | H01L 29/785 |
| | | | 257/347 |
| 2014/0027860 A1* | 1/2014 | Glass | H01L 21/823807 |
| | | | 257/401 |
| 2015/0255604 A1 | 9/2015 | Yang | |
| 2016/0020209 A1* | 1/2016 | Anderson | H01L 21/845 |
| | | | 257/383 |
| 2016/0148936 A1 | 5/2016 | Xu et al. | |
| 2016/0190325 A1* | 6/2016 | Liu | H01L 29/7856 |
| | | | 257/401 |
| 2016/0343572 A1* | 11/2016 | Doris | H01L 27/1211 |
| 2016/0351566 A1 | 12/2016 | Niimi et al. | |
| 2017/0047325 A1* | 2/2017 | Mehta | H01L 27/0886 |
| 2017/0047411 A1 | 2/2017 | Cheng et al. | |
| 2017/0054003 A1 | 2/2017 | Liao et al. | |
| 2017/0062601 A1 | 3/2017 | Basker et al. | |
| 2018/0006159 A1 | 1/2018 | Giullom et al. | |

OTHER PUBLICATIONS

Anonymous, "A Structure for Forming a Contact with Improved Contact Resistance and Overlay Tolerance", IP.com No. 000226568 Apr. 16, 2013.

Loubet et al., "Stacked nanosheet gate-all-around transistor to enable scaling beyond FinFET." In IEEE, 2017 Symposium on VLSI Technology, pp. T230-T231 2017.

* cited by examiner

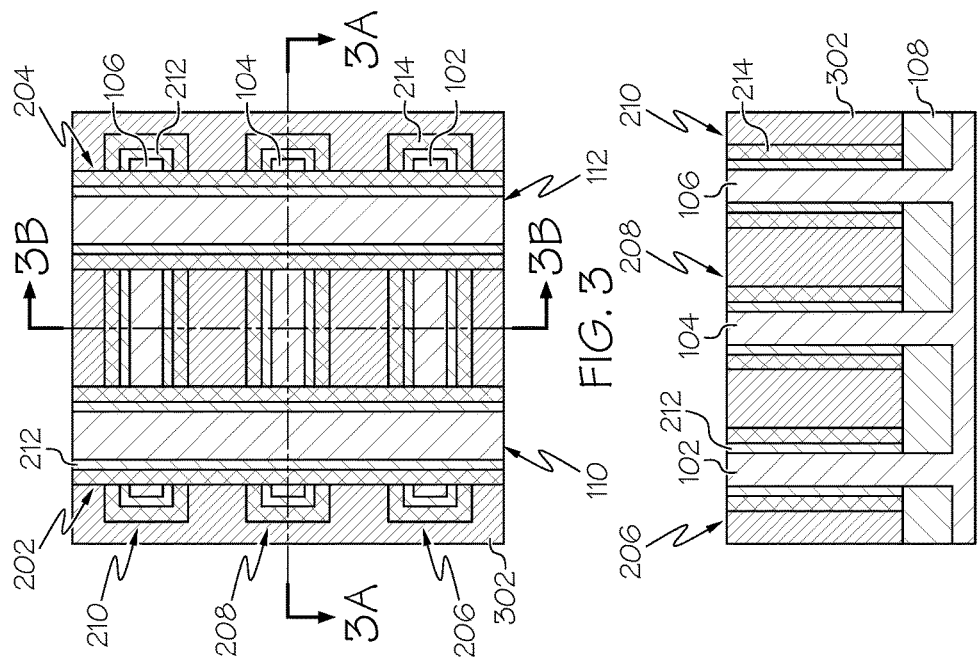
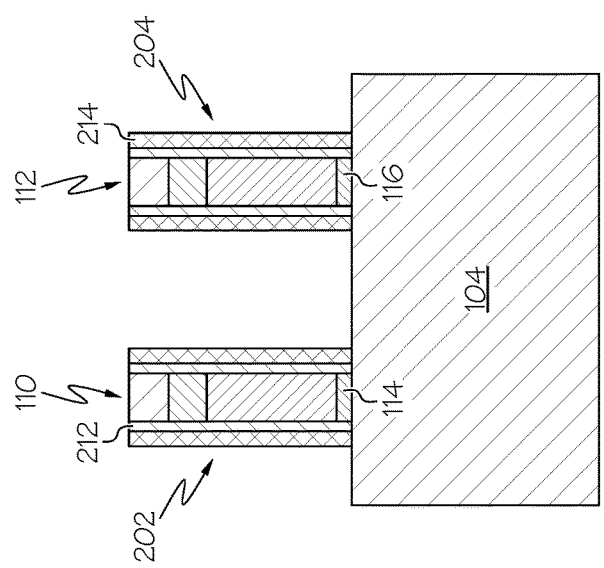
FIG. 3
FIG. 3B
FIG. 3A

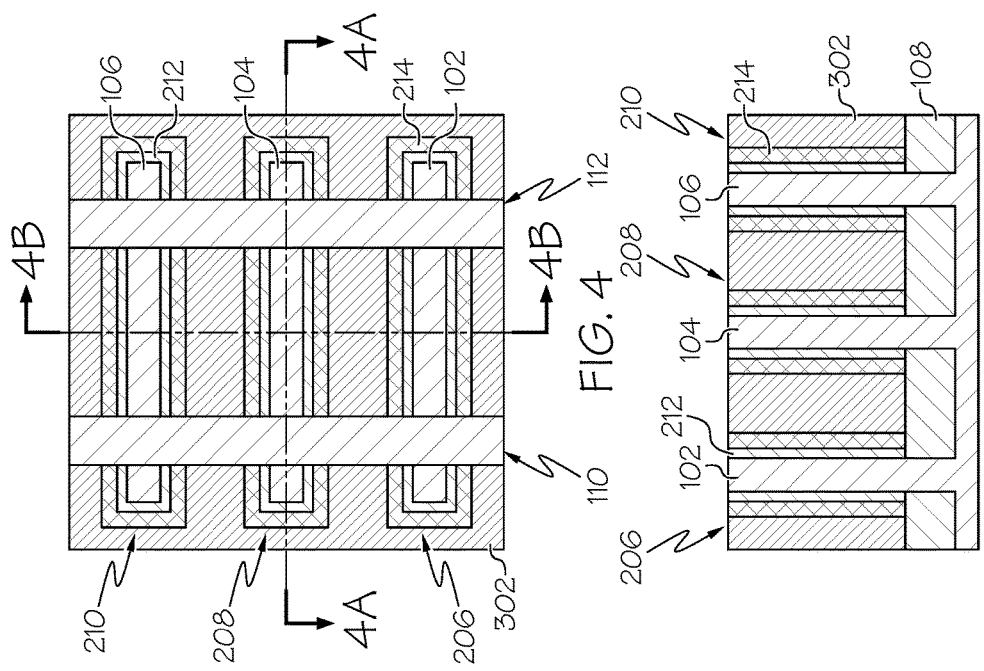
FIG. 4
FIG. 4B
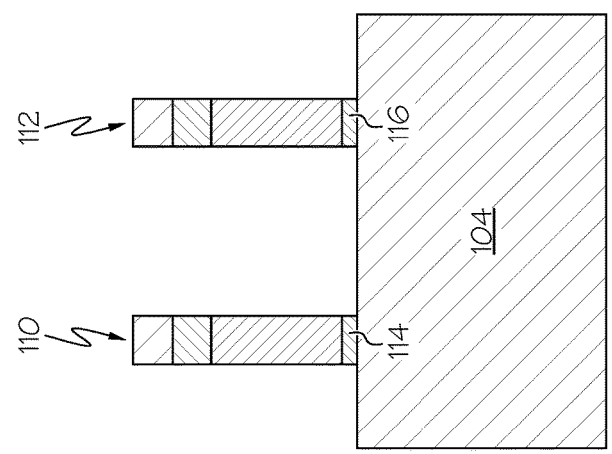
FIG. 4A

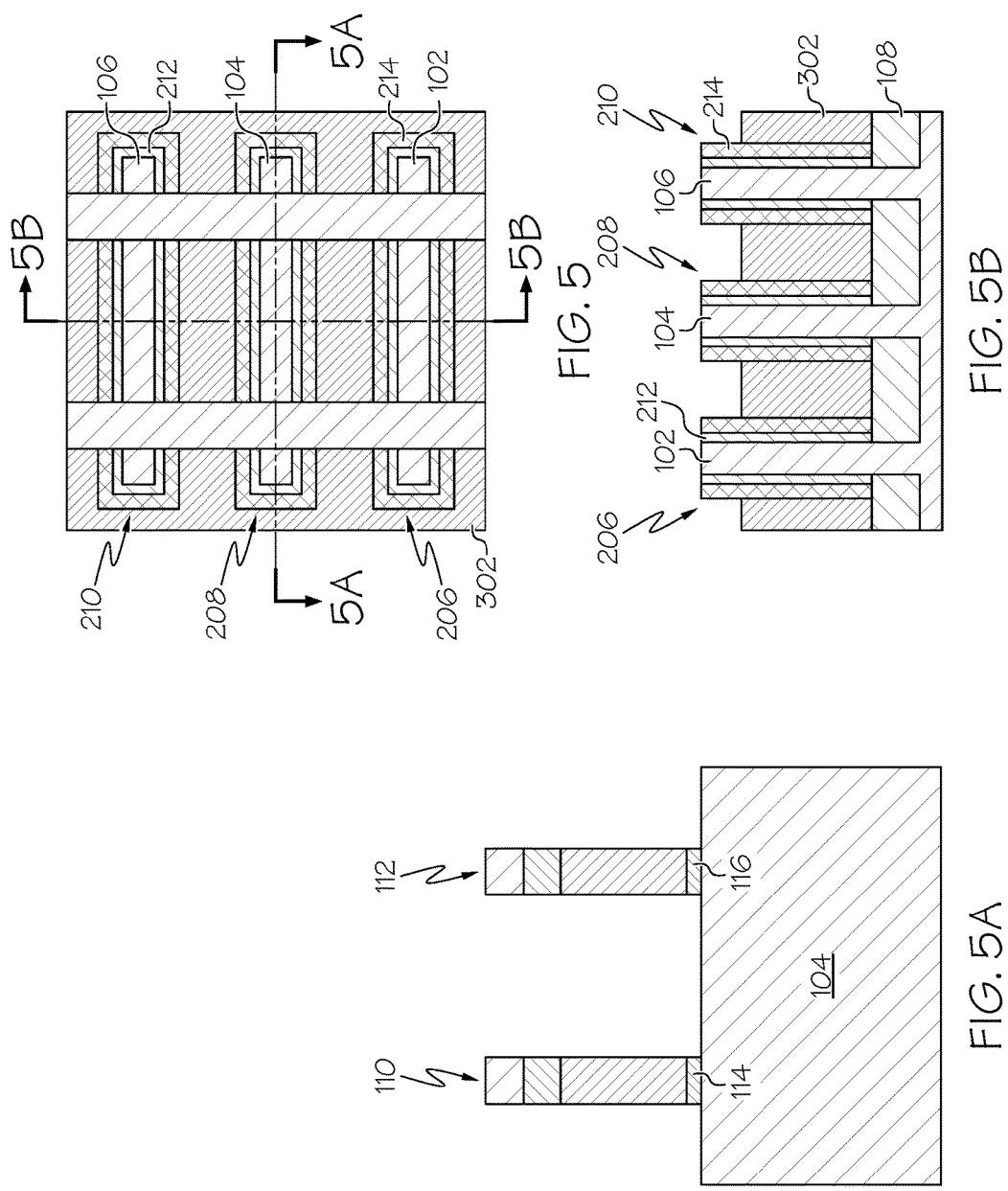

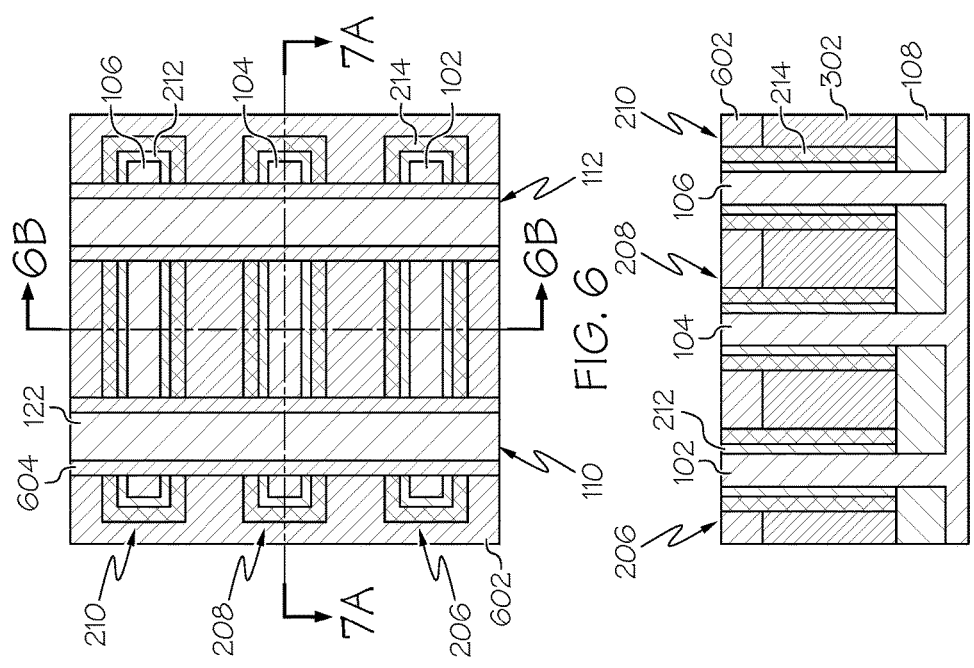
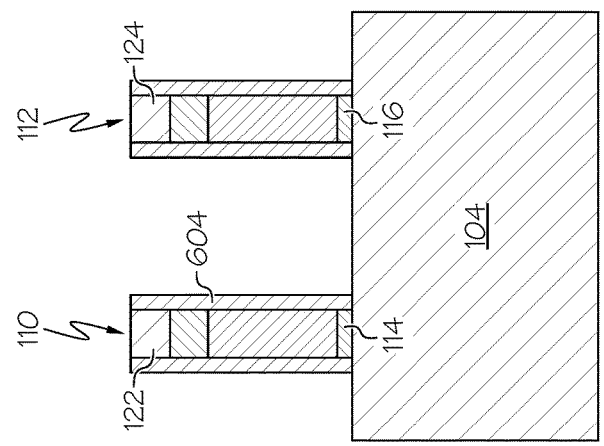
FIG. 6
FIG. 6B
FIG. 6A

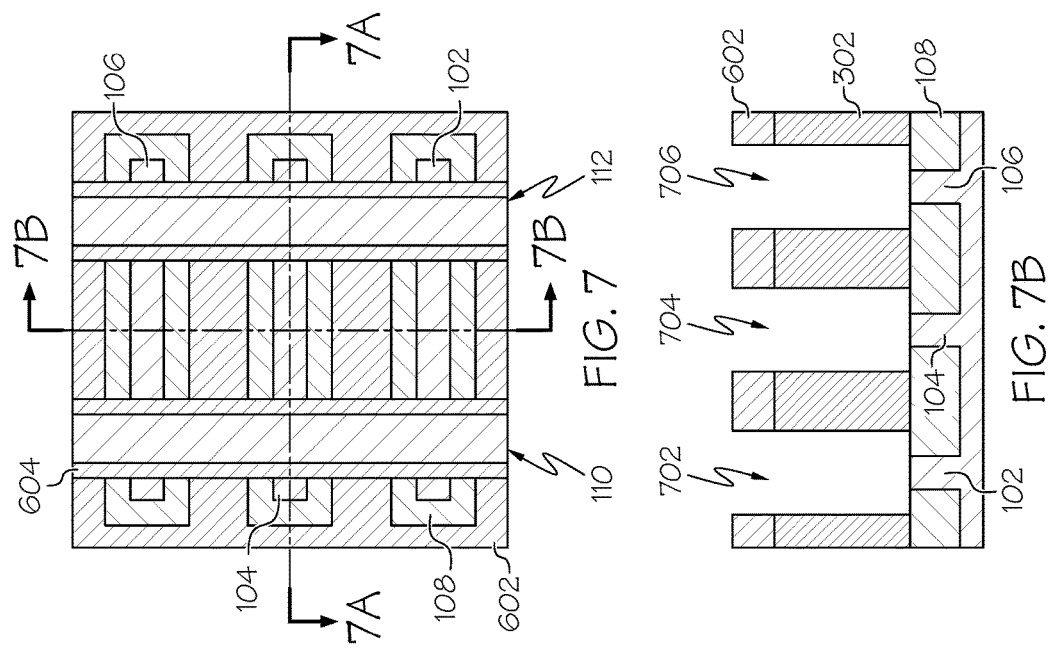
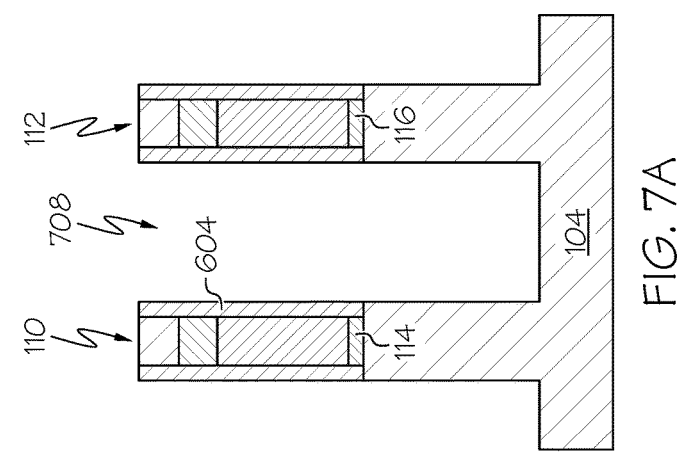

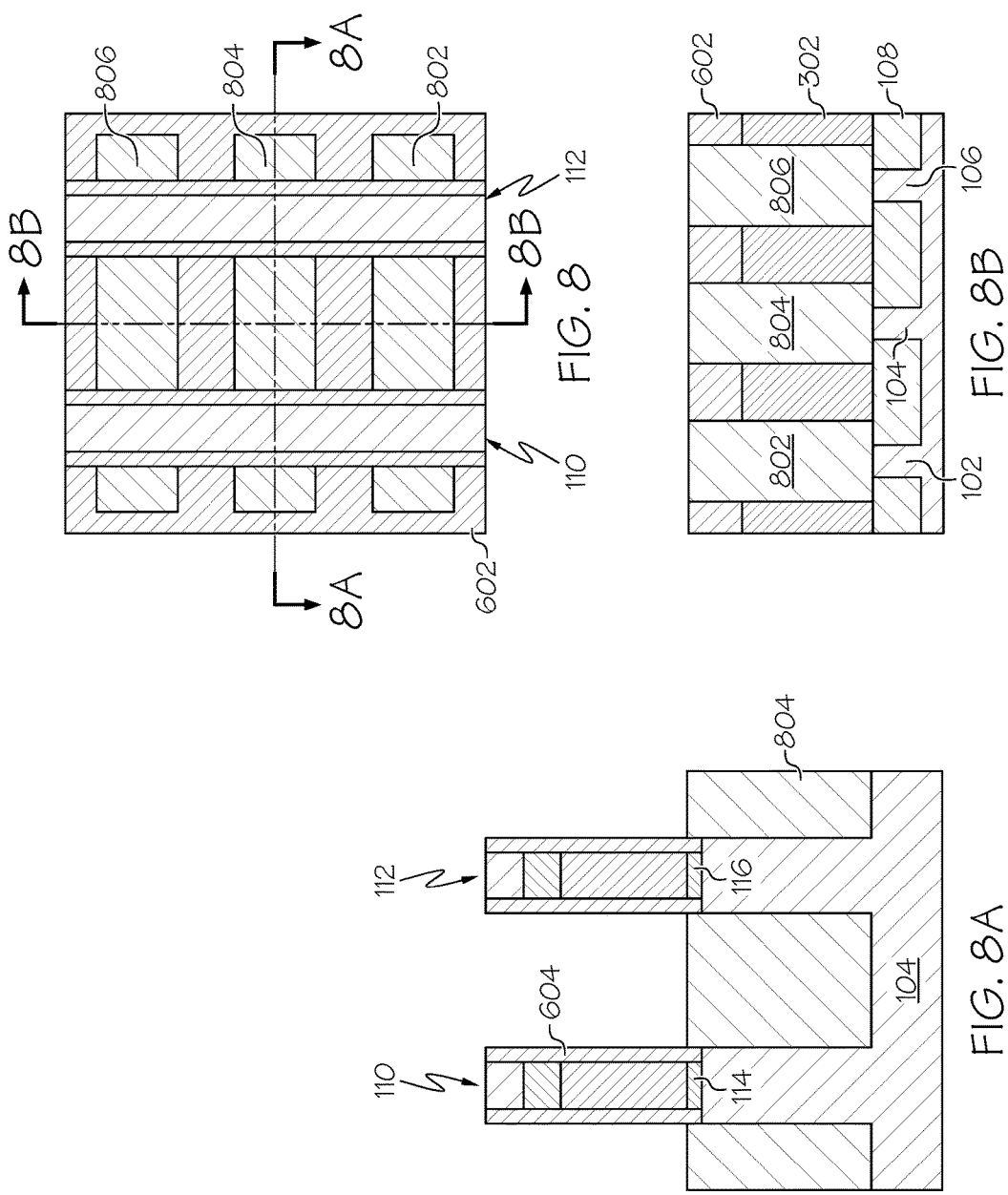

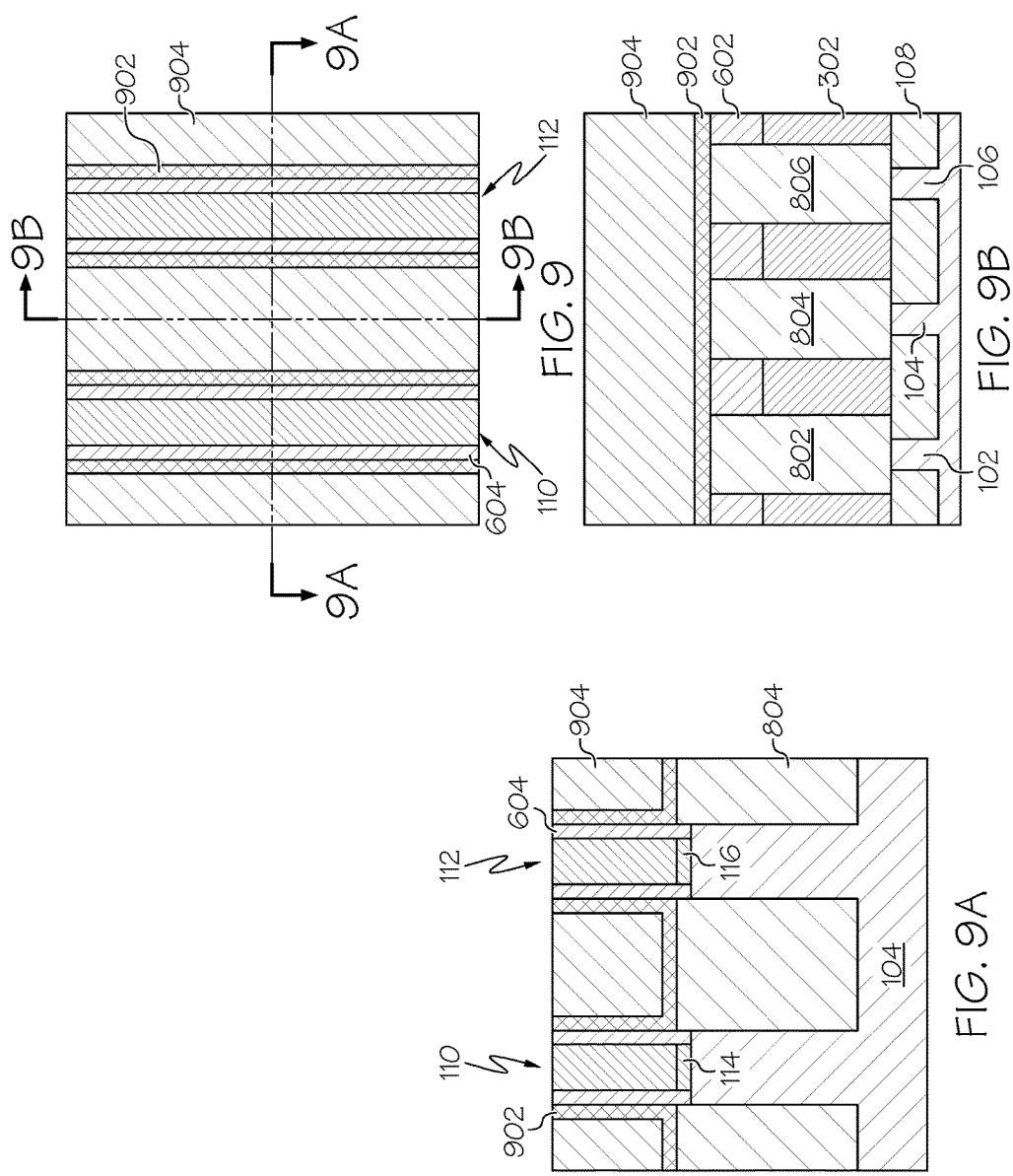

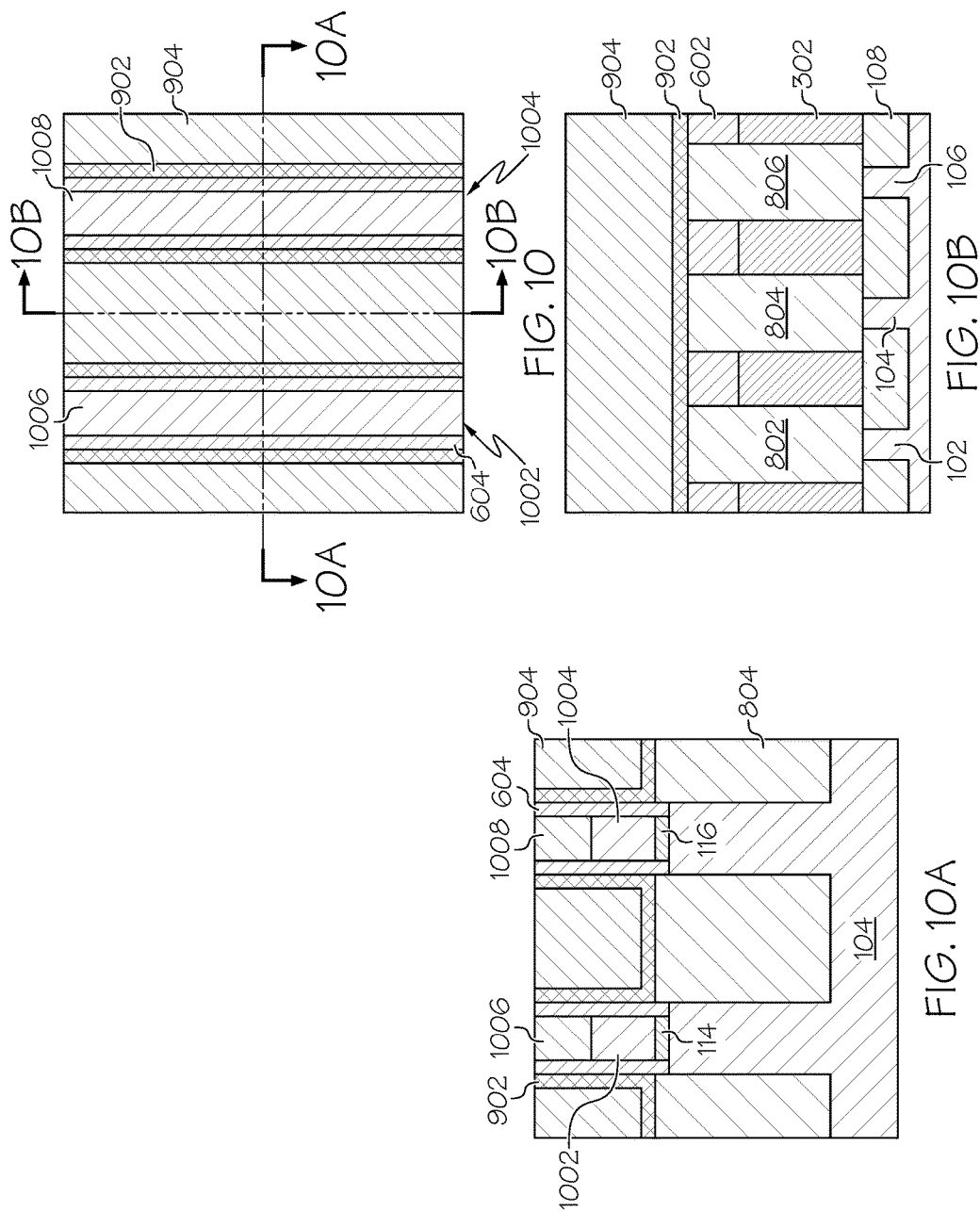

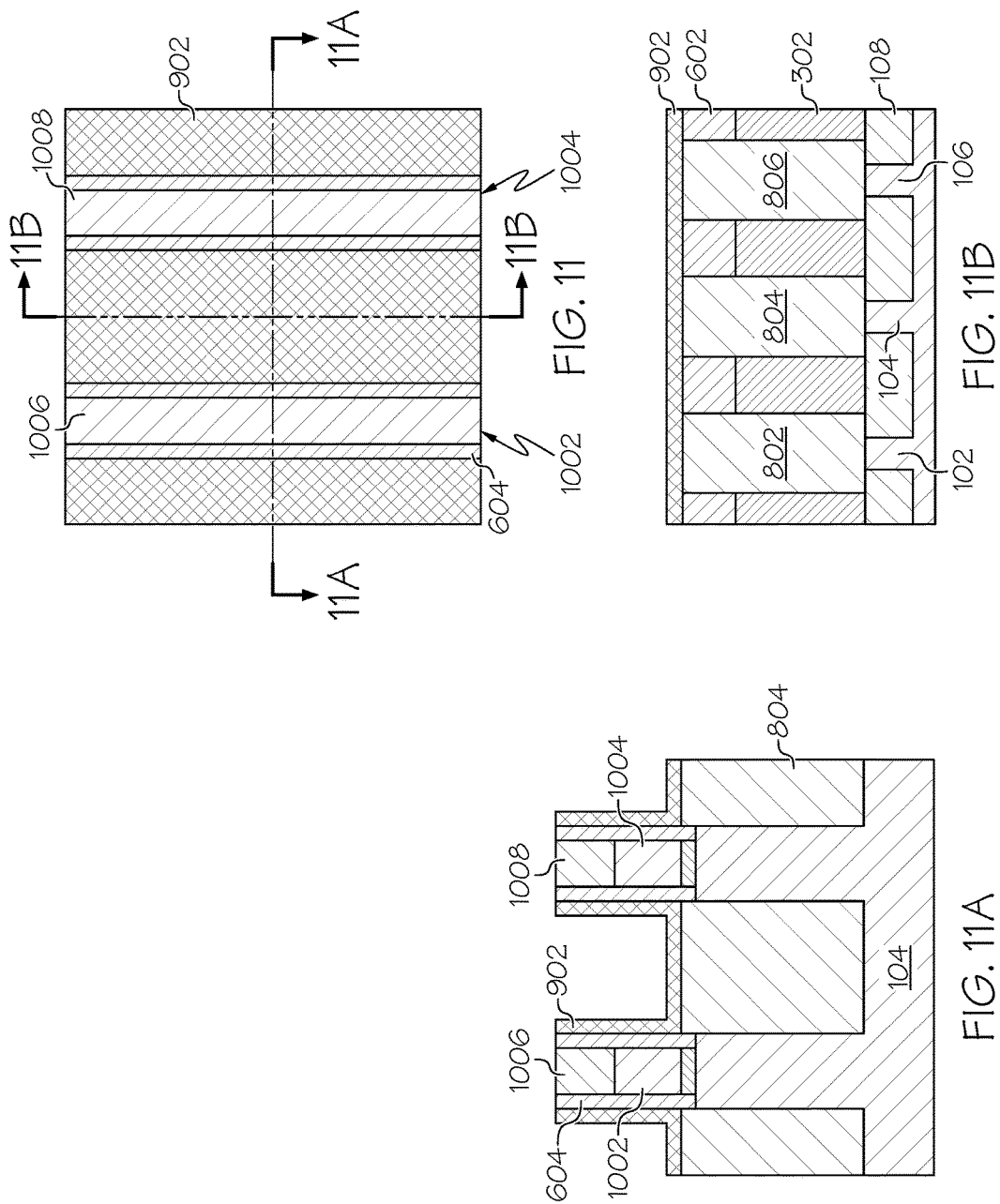

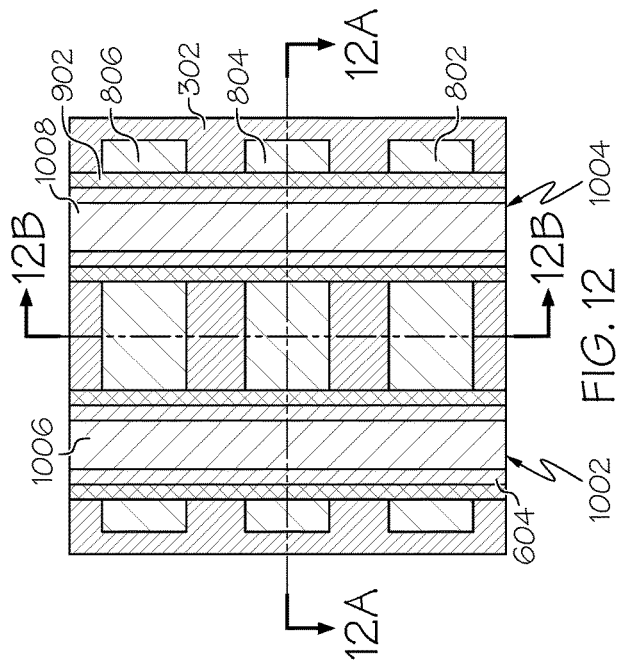
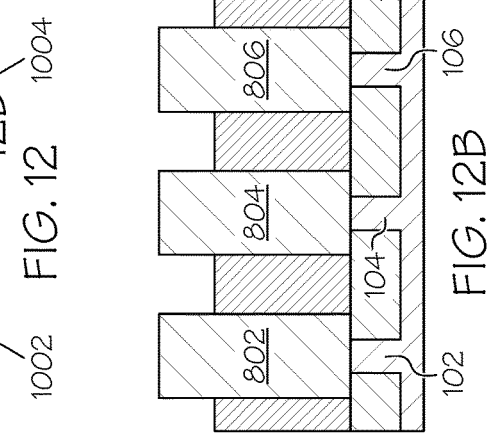
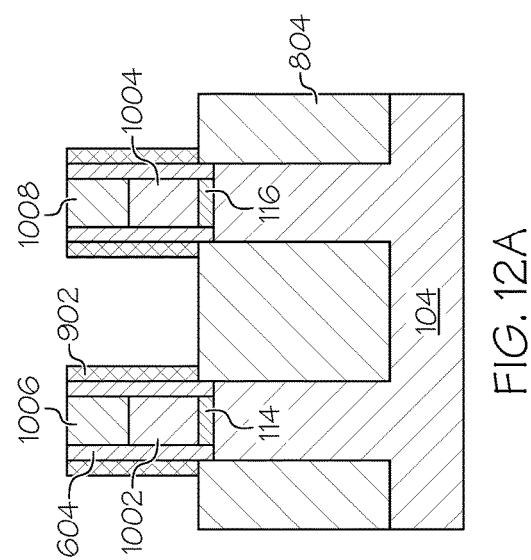
FIG. 12
FIG. 12B
FIG. 12A

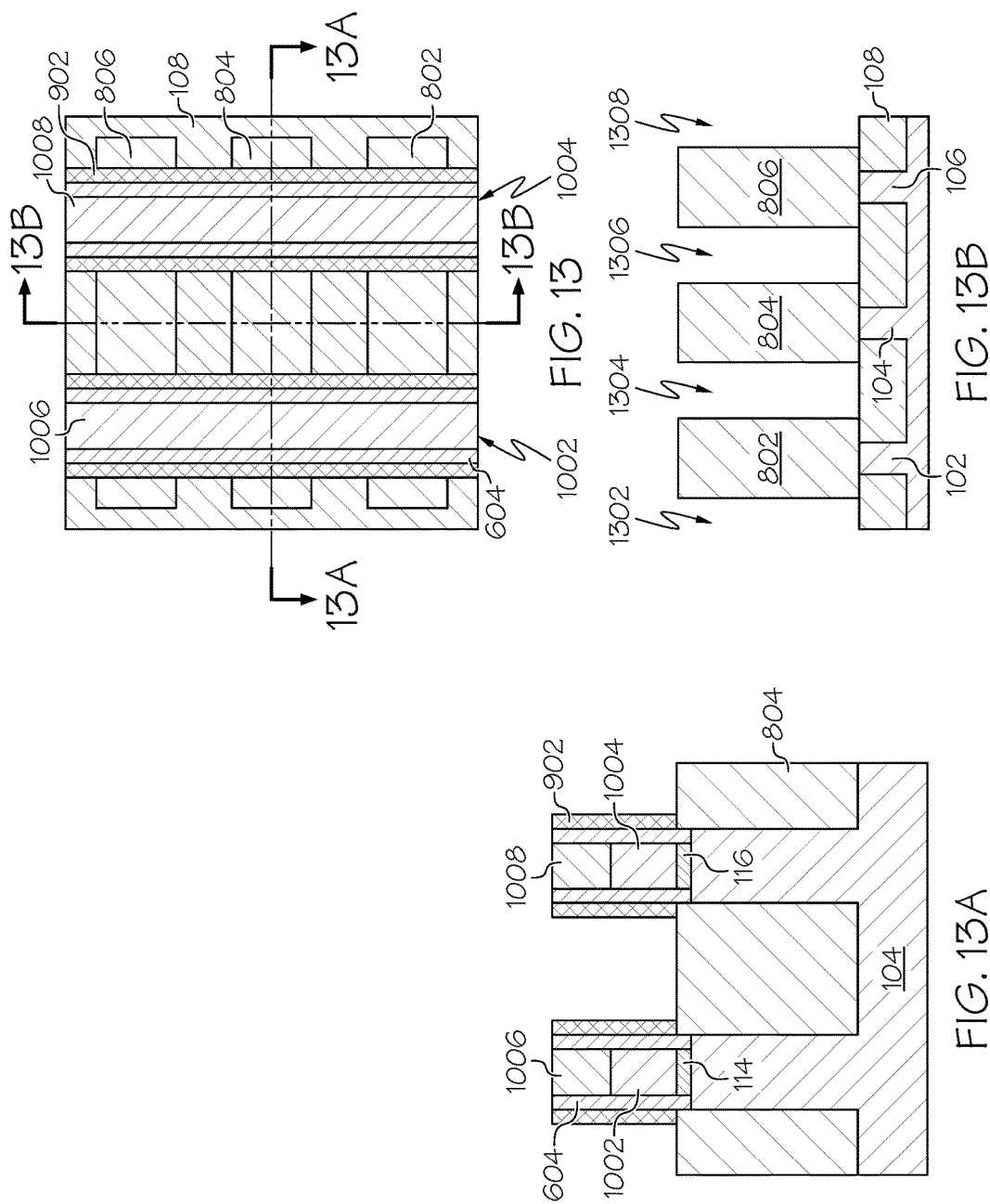

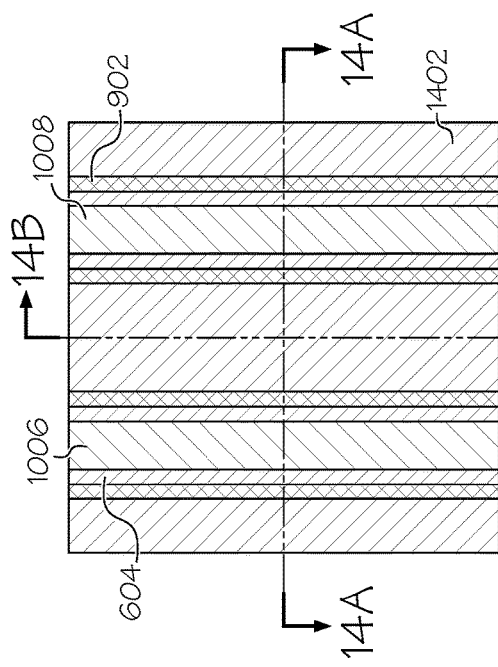
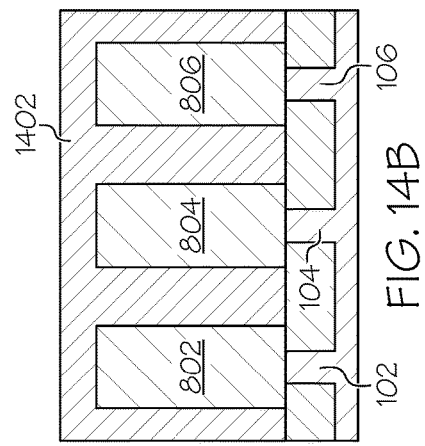
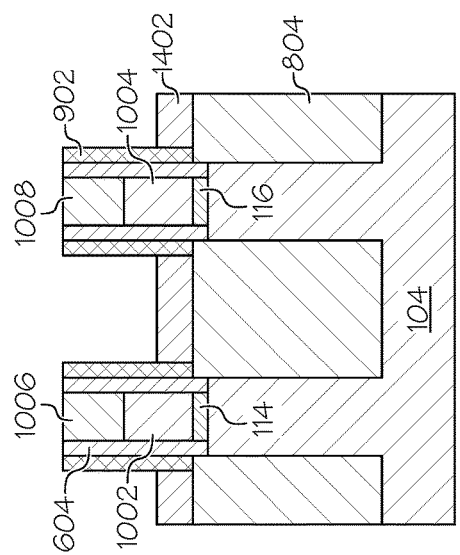
FIG. 14
FIG. 14B
FIG. 14A

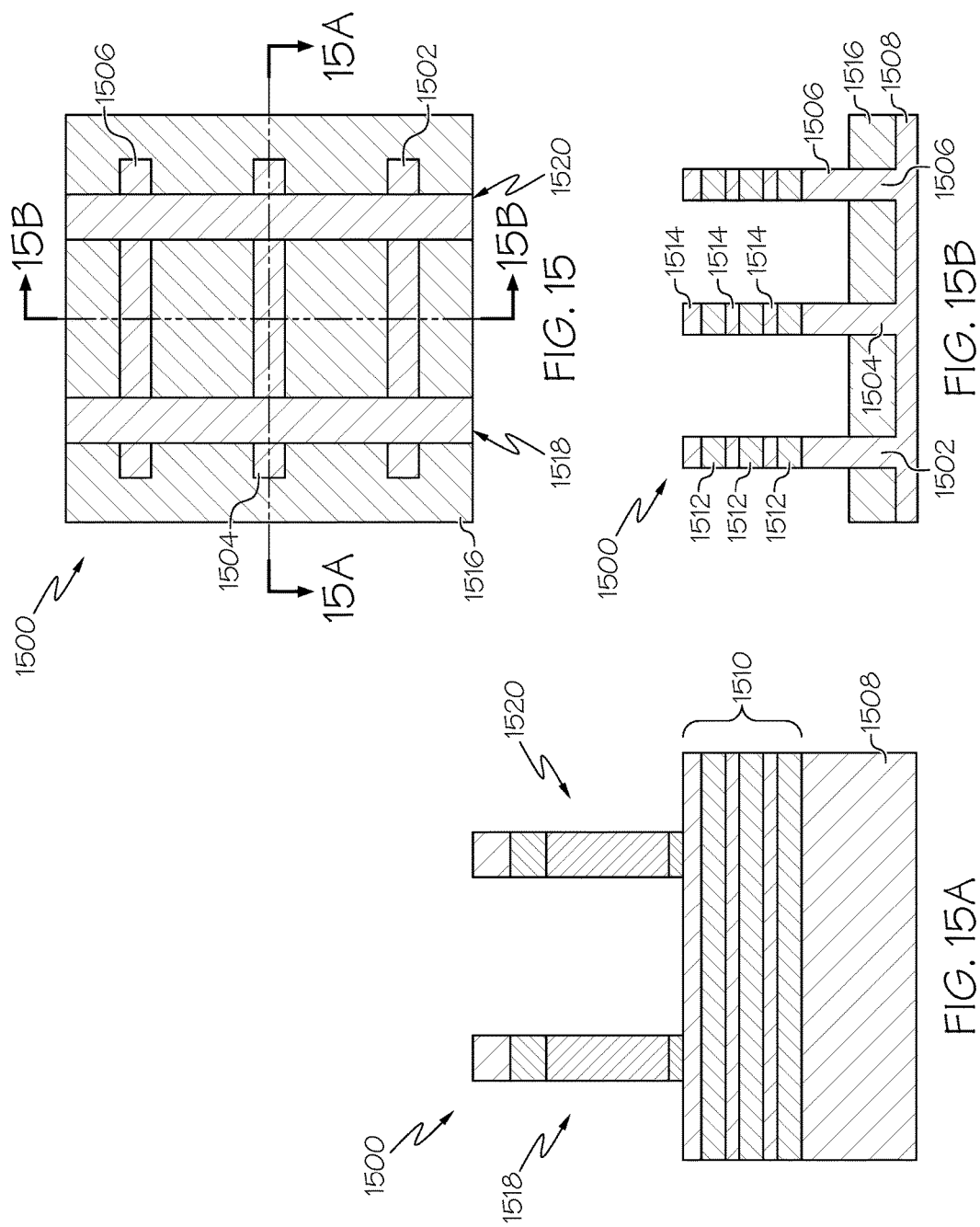

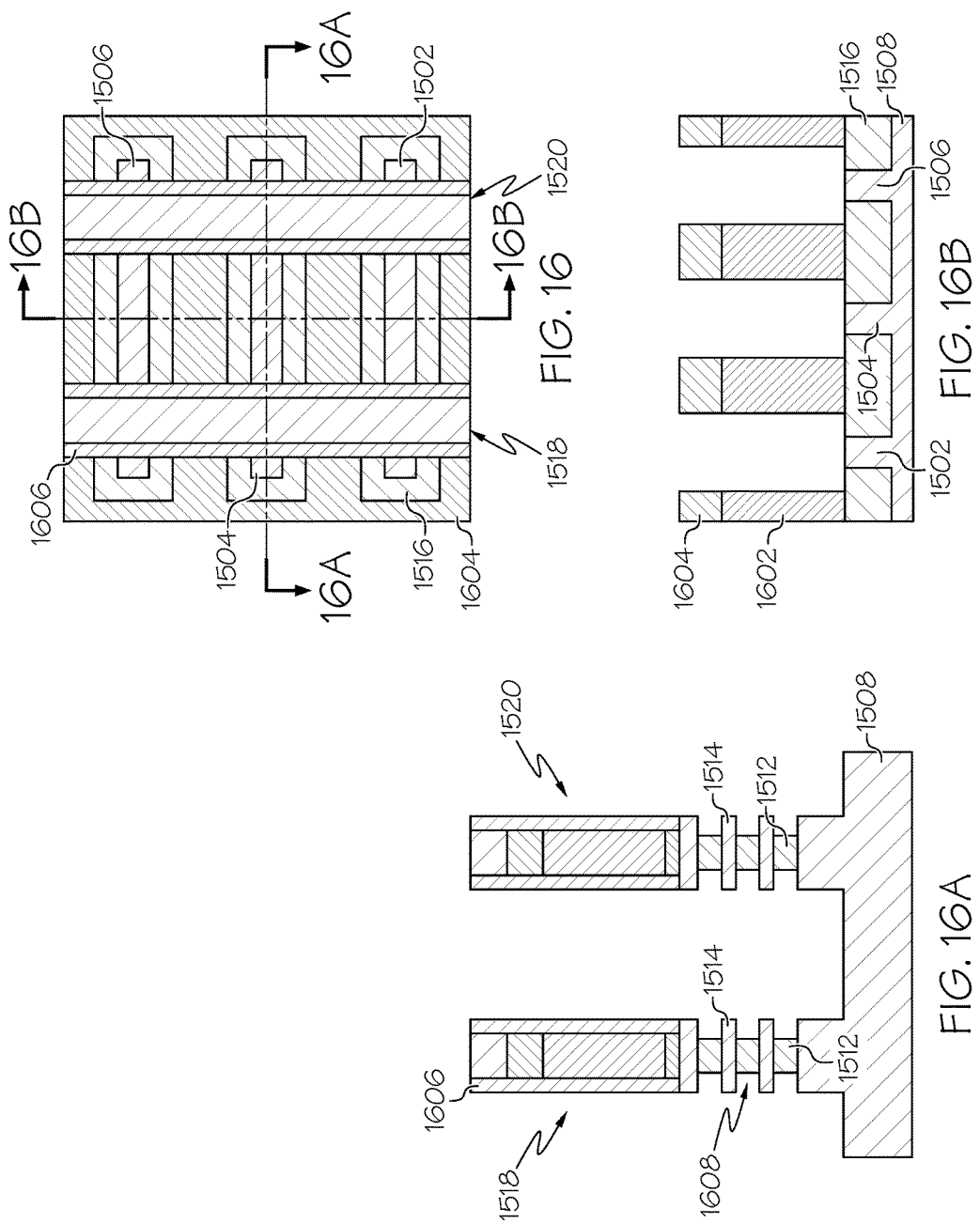

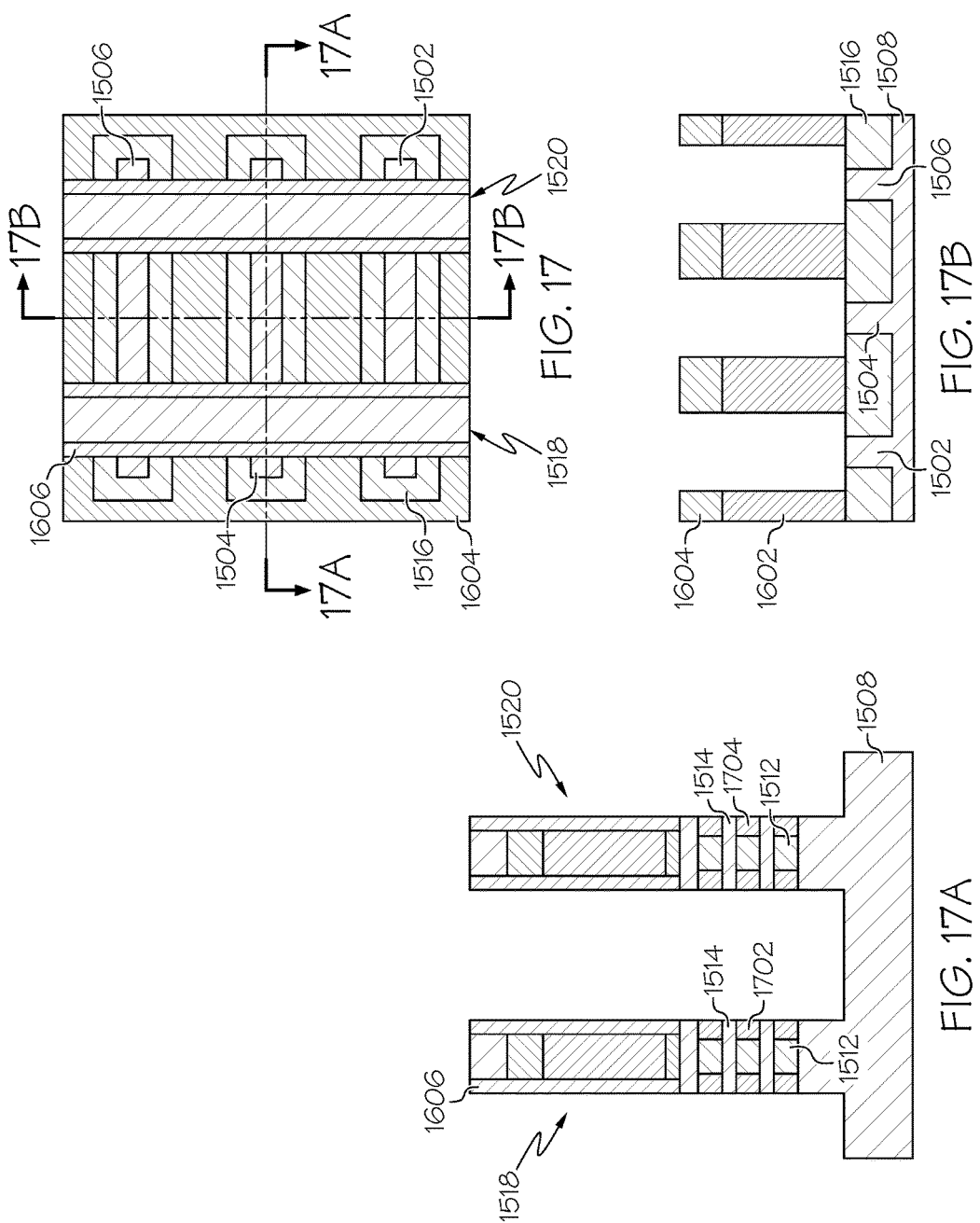

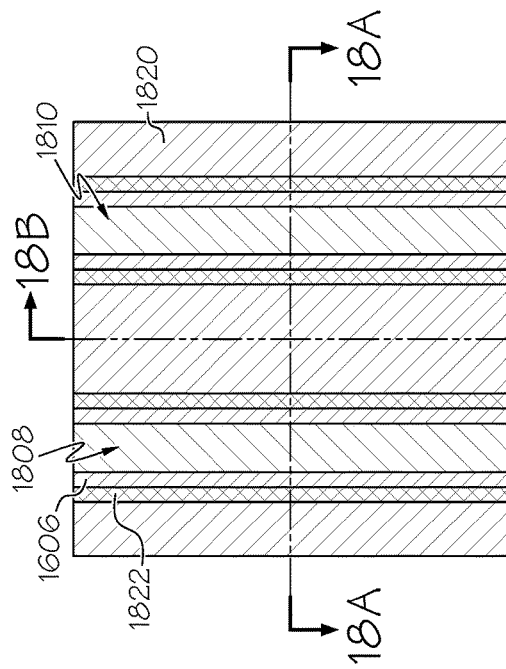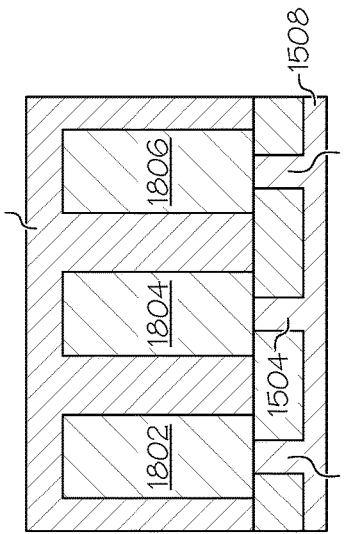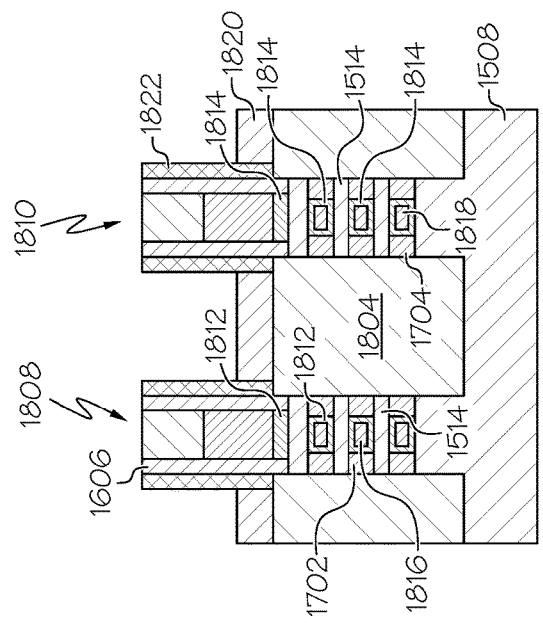

WRAP AROUND CONTACT USING SACRIFICIAL MANDREL

BACKGROUND OF THE INVENTION

The present disclosure generally relates to the field of semiconductors, and more particularly relates to wrap-around contact for semiconductor devices.

In standard field effect transistor fabrication, source and drain silicide contacts are usually formed only at the top surface of the doped regions. These doped regions may be formed by in-situ doped epitaxy of silicon and silicon germanium.

SUMMARY OF THE INVENTION

In one embodiment, a method for forming a semiconductor structure with a wrap around contact is disclosed. The method comprises at least the following operations. At least one mandrel layer is formed adjacent to at least one fin structure. The at least one fin structure and at least one source/drain is epitaxially grown in contact with the at least one fin structure and the at least one mandrel layer. The at least one mandrel layer is removed after the at least one source/drain has been epitaxially grown. At least one contact layer is formed in contact with sidewalls and a top surface of the at least one source/drain.

In another embodiment, a semiconductor structure is disclosed. The semiconductor structure comprises at least a plurality of unmerged fin structures; a separate source/drain in contact with each unmerged fin structure of the plurality of unmerged fin structures; and a contact layer formed on sidewalls and a top surface of each source/drain.

In yet another embodiment, an integrated circuit is disclosed. The integrated circuit comprises a semiconductor structure. The semiconductor structure comprises at least a plurality of unmerged fin structures; a separate source/drain in contact with each unmerged fin structure of the plurality of unmerged fin structures; and a contact layer formed on sidewalls and a top surface of each source/drain.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which:

FIG. 1A is a view of the structure shown in FIG. 1 taken along a line that passes through a fin structure according one embodiment of the present disclosure;

FIG. 1B is a cross-section view of the structure shown in FIG. 1 taken transverse to the long axis of the fin structures according one embodiment of the present disclosure;

FIG. 2A is a view of the structure shown in FIG. 2 taken along a line that passes through a fin structure according one embodiment of the present disclosure;

FIG. 2B is a cross-section view of the structure shown in FIG. 2 taken transverse to the long axis of the fin structures according one embodiment of the present disclosure;

FIG. 3 is a top view of the semiconductor structure after a mandrel layer has been formed in contact with the sacrificial spacer contacting portions of the fin structures between the dummy gates according one embodiment of the present disclosure;

FIG. 3A is a view of the structure shown in FIG. 3 taken along a line that passes through a fin structure according one embodiment of the present disclosure;

FIG. 3B is a cross-section view of the structure shown in FIG. 3 taken transverse to the long axis of the fin structures according one embodiment of the present disclosure;

FIG. 4 is a top view of the semiconductor structure after the sacrificial spacers in contact with the dummy gates have been removed according one embodiment of the present disclosure;

FIG. 4A is a view of the structure shown in FIG. 4 taken along a line that passes through a fin structure according one embodiment of the present disclosure;

FIG. 4B is a cross-section view of the structure shown in FIG. 4 taken transverse to the long axis of the fin structures according one embodiment of the present disclosure;

FIG. 5 is a top view of the semiconductor structure after a portion of the mandrel layers have has been recessed according one embodiment of the present disclosure;

FIG. 5A is a view of the structure shown in FIG. 5 taken along a line that passes through a fin structure according one embodiment of the present disclosure;

FIG. 5B is a cross-section view of the structure shown in FIG. 5 taken transverse to the long axis of the fin structures according one embodiment of the present disclosure;

FIG. 6 is a top view of the semiconductor structure after a protective layer has been formed in contact with sidewalls of the dummy gate and a top surface of the mandrel layers according one embodiment of the present disclosure;

FIG. 6A is a view of the structure shown in FIG. 6 taken along a line that passes through a fin structure according one embodiment of the present disclosure;

FIG. 6B is a cross-section view of the structure shown in FIG. 6 taken transverse to the long axis of the fin structure according one embodiment of the present disclosure;

FIG. 7 is a top view of the semiconductor structure after exposed portions of the fin structures have been recessed and remaining sacrificial spacers have been removed according one embodiment of the present disclosure;

FIG. 7A is a view of the structure shown in FIG. 7 taken along a line that passes through a fin structure according one embodiment of the present disclosure;

FIG. 7B is a cross-section view of the structure shown in FIG. 7 taken transverse to the long axis of the fin structures according one embodiment of the present disclosure;

FIG. 8 is a top view of the semiconductor structure after sources/drains have been formed according one embodiment of the present disclosure;

FIG. 8A is a view of the structure shown in FIG. 8 taken along a line that passes through a fin structure according one embodiment of the present disclosure;

FIG. 8B is a cross-section view of the structure shown in FIG. 8 taken transverse to the long axis of the fin structures according one embodiment of the present disclosure;

FIG. 9 is a top view of the semiconductor structure after a contact etch stop layer and an inter-layer dielectric has been formed according one embodiment of the present disclosure;

FIG. 9A is a view of the structure shown in FIG. 9 taken along a line that passes through a fin structure according one embodiment of the present disclosure;

FIG. 9B is a cross-section view of the structure shown in FIG. 9 taken transverse to the long axis of the fin structures according one embodiment of the present disclosure;

FIG. 10 is a top view of the semiconductor structure after the dummy gates have been removed and replacement gates have been formed according one embodiment of the present disclosure;

FIG. 10A is a view of the structure shown in FIG. 10 taken along a line that passes through a fin structure according one embodiment of the present disclosure;

FIG. 10B is a cross-section view of the structure shown in FIG. 10 taken transverse to the long axis of the fin structures according one embodiment of the present disclosure;

FIG. 11 is a top view of the semiconductor structure after the inter-dielectric layer has been removed according one embodiment of the present disclosure;

FIG. 11A is a view of the structure shown in FIG. 11 taken along a line that passes through a fin structure according one embodiment of the present disclosure;

FIG. 11B is a cross-section view of the structure shown in FIG. 11 taken transverse to the long axis of the fin structures according one embodiment of the present disclosure;

FIG. 12 is a top view of the semiconductor structure after portions of the contact etch stop layer has been removed and the protective layer in contact with the mandrel layers has been removed according one embodiment of the present disclosure;

FIG. 12A is a view of the structure shown in FIG. 12 taken along a line that passes through a fin structure according one embodiment of the present disclosure;

FIG. 12B is a cross-section view of the structure shown in FIG. 12 taken transverse to the long axis of the fin structures according one embodiment of the present disclosure;

FIG. 13 is a top view of the semiconductor structure after the mandrel layers have been removed according one embodiment of the present disclosure;

FIG. 13A is a view of the structure shown in FIG. 13 taken along a line that passes through a fin structure according one embodiment of the present disclosure;

FIG. 13B is a cross-section view of the structure shown in FIG. 13 taken transverse to the long axis of the fin structures according one embodiment of the present disclosure;

FIG. 14 is a top view of the semiconductor structure after a wrap-around contact layer has been formed in contact and surrounding the sources/drains according one embodiment of the present disclosure;

FIG. 14A is a view of the structure shown in FIG. 14 taken along a line that passes through a fin structure according one embodiment of the present disclosure;

FIG. 14B is a cross-section view of the structure shown in FIG. 14 taken transverse to the long axis of the fin structures according one embodiment of the present disclosure;

FIG. 15 is a top view of a semiconductor structure after a plurality of fin structures comprising an alternating stack of semiconductor material layers, and dummy gates have been formed according one embodiment of the present disclosure;

FIG. 15A is a view of the structure shown in FIG. 15 taken along a line that passes through a fin structure according one embodiment of the present disclosure;

FIG. 15B is a cross-section view of the structure shown in FIG. 15 taken transverse to the long axis of the fin structures according one embodiment of the present disclosure;

FIG. 16 is a top view of a semiconductor structure after a first semiconductor material layer of the alternating stacks have been recessed to form indentations according one embodiment of the present disclosure;

FIG. 16A is a view of the structure shown in FIG. 16 taken along a line that passes through a fin structure according one embodiment of the present disclosure;

FIG. 16B is a cross-section view of the structure shown in FIG. 16 taken transverse to the long axis of the fin structures according one embodiment of the present disclosure;

FIG. 17 is a top view of a semiconductor structure after an inner spacer has been formed filling the indented regions of the alternating stacks of semiconductor material layers according one embodiment of the present disclosure;

FIG. 17A is a view of the structure shown in FIG. 17 taken along a line that passes through a fin structure according one embodiment of the present disclosure;

FIG. 17B is a cross-section view of the structure shown in FIG. 17 taken transverse to the long axis of the fin structures according one embodiment of the present disclosure;

FIG. 18 is a top view of the semiconductor structure after a wrap-around contact layer has been formed in contact and surrounding sources/drains of the fin structures comprising alternating stacks of semiconductor material layers according one embodiment of the present disclosure;

FIG. 18A is a view of the structure shown in FIG. 18 taken along a line that passes through a fin structure according one embodiment of the present disclosure;

FIG. 18B is a cross-section view of the structure shown in FIG. 18 taken transverse to the long axis of the fin structures according one embodiment of the present disclosure;

DETAILED DESCRIPTION

Figure 1:
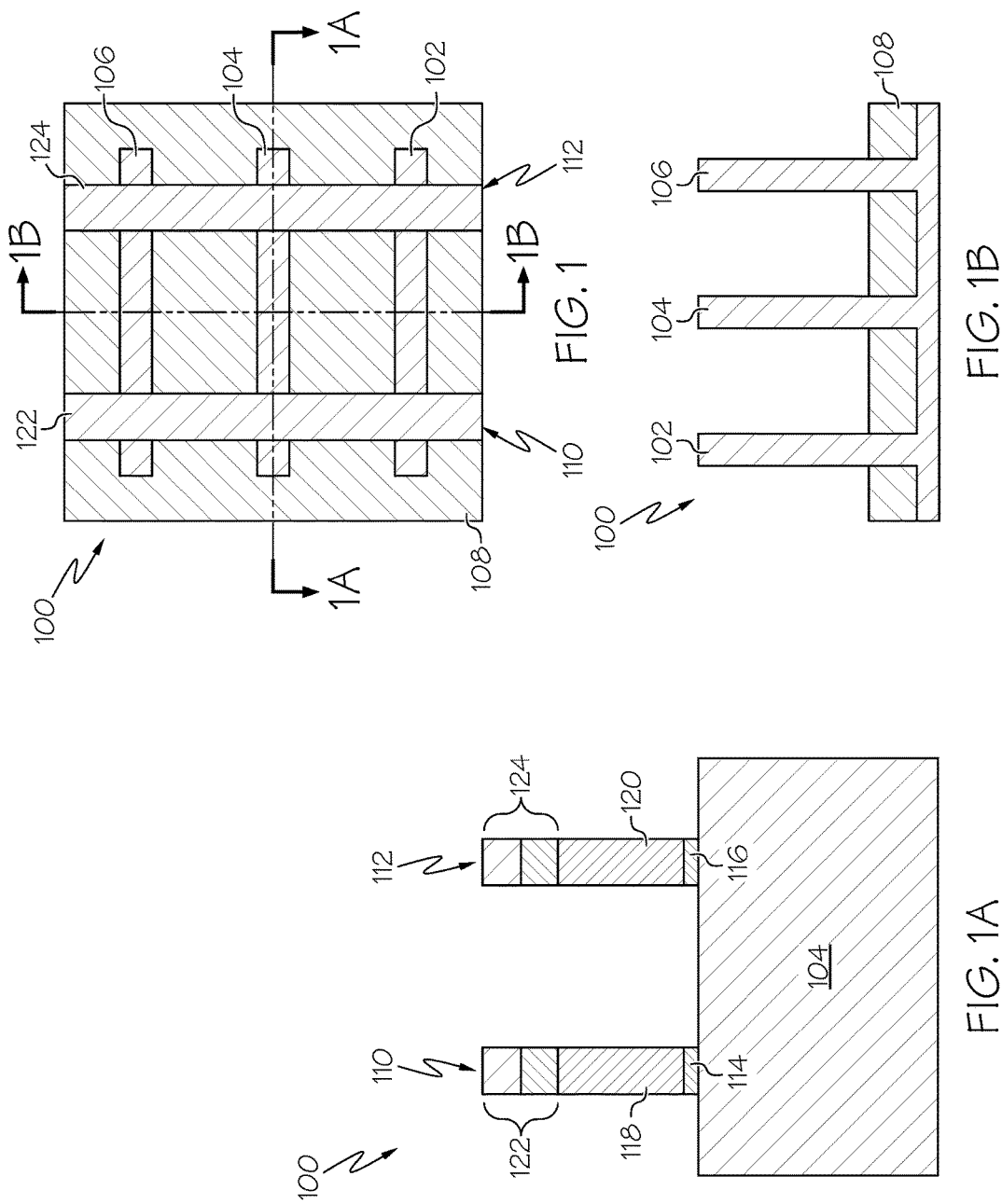
FIG. 1 is a top view of a semiconductor structure after a plurality of fin structures and dummy gates have been formed according one embodiment of the present disclosure.

It is to be understood that the present disclosure will be described in terms of a given illustrative architecture; however, other architectures, structures, substrate materials and process features and steps may be varied within the scope of the present disclosure.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present disclosure may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

Referring now to the drawings in which like numerals represent the same of similar elements, FIGS. 1 to 14B illustrate various processes for fabricating semiconductor structures or devices utilizing sacrificial mandrels to form wrap-around contacts. In general, the figures comprise a plain view and various cross-sectional views that are taken where indicated in the plain view. More specifically, the view "A" is taken along a line that passes through a fin, while view "B" is a cross-section view that is taken transverse to the long axis of the fins. It should be noted that one or more embodiments are not limited to the processes discussed below for forming the initial semiconductor structures, gate structures, etc. This discussion is provided for illustration purposes, and any process for fabricating the initial structures is applicable to embodiments of the present disclosure.

FIG. 1 shows a semiconductor structure 100 at a point in the fabrication process where one or more embodiments are implemented. It should be noted that although the following embodiments use a finFET device as one example of a semiconductor structure being fabricated, embodiments of the present invention are also applicable to gate-all-around devices such as nanosheet devices. In the embodiment shown in FIGS. 1 to 1B fin structures 102, 104, 106 have been formed from a bulk substrate. In other embodiments, the fin structures 102, 104, 106 may be formed on a silicon-on-insulator (SOI) substrate. In this example, an optional dielectric layer (e.g., a BOX layer or oxide layer) overlies the substrate, and the fin structures 102, 104, 106 are formed on and in contact with the dielectric layer. In one embodiment, the substrate may comprise at least one of Si, Ge alloys, SiGe, GaAs, InAs, InP, SiCGe, SiC, and other III/V or II/VI compound semiconductors. The substrate may be appropriately doped either with p-type dopant atoms and/or with n-type dopant atoms, or the material can be substantially undoped (intrinsic).

The optional dielectric layer may be formed from any of several dielectric materials. Non-limiting examples include, for example, oxides, nitrides and oxynitrides of silicon. The dielectric layer may also include oxides, nitrides and oxynitrides of elements other than silicon. In addition, the dielectric layer may include crystalline or non-crystalline dielectric material. Moreover, the dielectric layer may be formed using any of several methods. Non-limiting examples include ion implantation methods, thermal or plasma oxidation or nitridation methods, chemical vapor deposition methods and physical vapor deposition methods. The dielectric layer may include a thickness ranging from about 5 nm to about 200 nm. In one embodiment, the dielectric layer may be about 25 nm thick.

The fin structures 102, 104, 106 comprise a semiconductor material such as Si, SiGe, and/or the like. In an embodiment where the fins structures are formed on an SOI substrate, the fin structures and the substrate can be made of the same or different materials. In an SOI embodiment, the semiconductor material/layer from which the fin structures 102, 104, 106 are fabricated may be formed utilizing various methods such as a layer transfer process including a bonding step, or an implantation process such as SIMOX (Separation by IMplantation of OXygen). This semiconductor material/ layer nay be undoped or doped with either p-type or n-type dopants through ion implantation, plasma doping, or gas phase doping. P-type transistors are produced by doping the semiconductor material/layer with elements from group III of the periodic table (e.g., boron, aluminum, gallium, or indium). As an example, the dopant can be boron in a concentration ranging from 1×10E18 atoms/cm3 to 2×10E21 atoms/cm3. N-type transistors are produced by doping the semiconductor material/layer with elements from group V of the periodic table (e.g., phosphorus, antimony, or arsenic).

The fin structures 102, 104, 106 may be formed by forming an etch-stop capping layer onto the substrate (or semiconductor layer) through, for example, deposition. The etch-stop capping layer, in one embodiment, may be made of silicon-nitride although other material suitable in providing etch-stop function may be used as well. The fin structures 102, 104, 106 are subsequently formed or etched out of the substrate (or semiconductor layer) through a process involving masking, using industry-standard lithographic techniques, and directionally etching (e.g., RIE) the etch-stop capping layer and underneath substrate (or semiconductor layer). After the RIE etching process, the photo-resist mask used in the lithographic etching process may be removed, leaving the fin structures 102, 104, 106.

After forming multiple fins structures 102, 104, 106, isolation regions 108 are formed between the fin structures 102, 104, 106. In some embodiments, an insulating film (e.g. $SiO_2$) is deposited to form the isolation regions 108 for device isolation. These structures are may obtained by depositing the insulating film, followed by a recess process using RIE or wet etching. In an SOI embodiment, the isolation regions 108 do not need to be formed.

FIGS. 1 to 1B further show that one or more dummy gates 110, 112 have been formed over a portion of each fin structure 102, 104, 106. In one example, the dummy is amorphous silicon. In one embodiment, an etch stop layer 114, 116 (e.g., an oxide layer) is formed in contact with the portions of the fin structures 102, 104, 106 on which the dummy gates 110, 112 are to be formed. The dummy gates 110, 112, comprise, for example, polysilicon, amorphous silicon, or nitride 118, 120 in contact with the etch stop layer 114, 116; and a bi-layer oxide mask (e.g., nitride-oxide) 122, 124.

Figure 2:
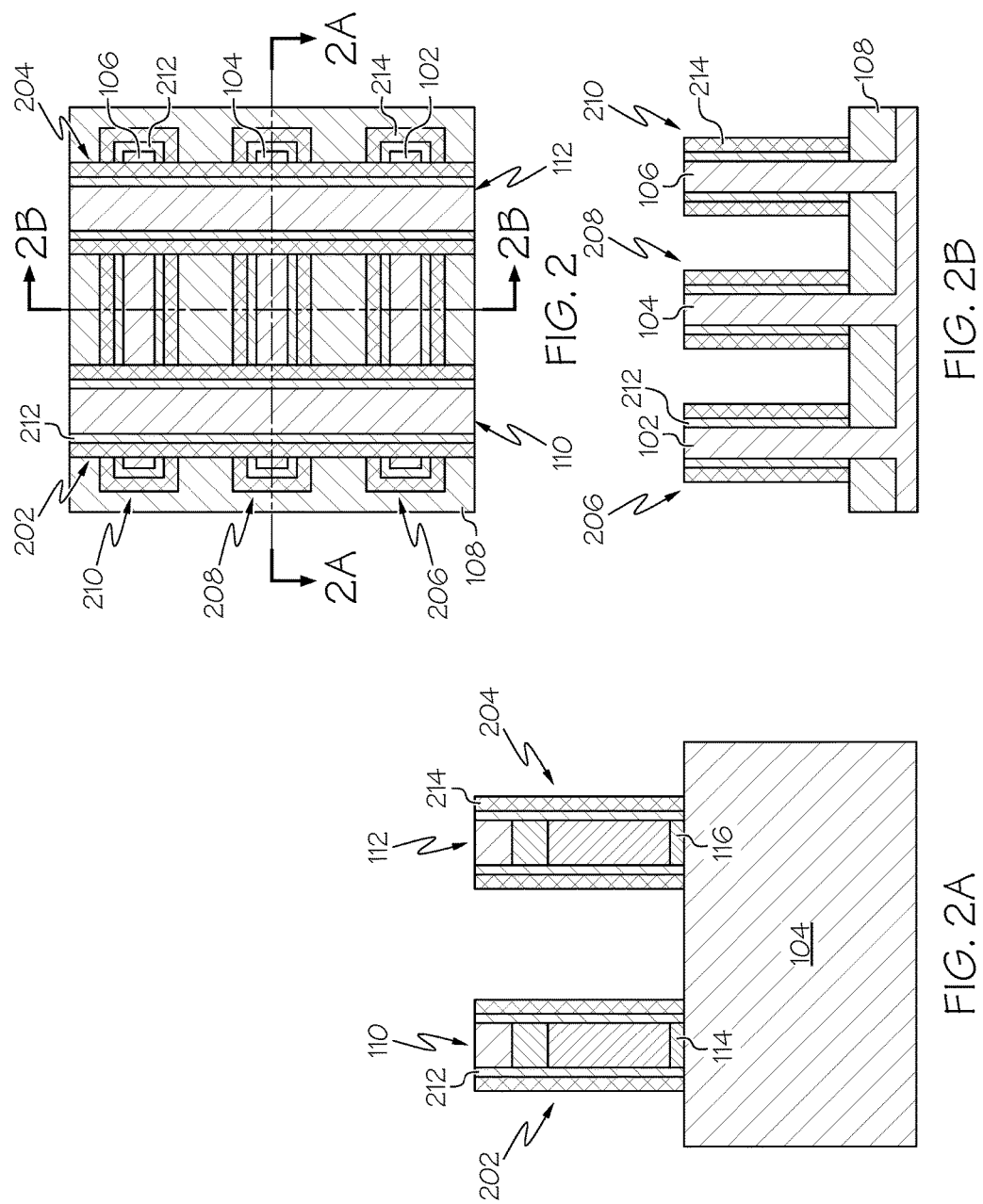
FIG. 2 is a top view of the semiconductor structure after sacrificial spacers have been formed in contact with the dummy gates and a portion of the fin structures according one embodiment of the present disclosure.

FIGS. 2 to 2B show that a sacrificial spacer 202, 204, is formed on and in contact with the dummy gates 110, 112, and further show that a sacrificial spacer 206, 208, 210 is formed on and in contact with each of the fin structures 102, 104, 106. The dummy gate sacrificial spacers 202, 204 contact at least the sidewalls of each dummy gate 110, 112 and a top surface of one or more portions of the fin structures 102, 104, 106. The fin structure sacrificial spacers 206, 208, 210 contact the sidewalls of the fins structures and a top surface of the isolation regions 108. The sacrificial spacers 202 to 210 are formed using one or more spacer formation techniques. For example, the sacrificial spacers 202 to 210 may be formed by isotropically depositing one or more conformal layers of insulating material (e.g., silicon oxide, silicon nitride, silicon oxynitride, and high-k dielectric material and the like) followed by an anisotropic etch (e.g., reactive ion etch (RIE)) of that material to form a spacer(s). In the example shown in FIGS. 2 to 2B, the sacrificial spacers 202 to 210 comprise an oxide layer 212 and nitride line 214 formed in contact with the oxide layer 212. In one embodiment, the top surface of each sacrificial spacer 202 to 210 does not extend above the top surface of their respective dummy gate 110, 112 or fin structure 102, 104, 106.

A sacrificial layer (mandrel) 302 is then formed between each fin structure 102, 104, 106, as shown in FIGS. 3 to 3B. In one embodiment, the mandrel layer 302 is formed by depositing a material such as amorphous carbon (a-C), amorphous silicon carbon (a-SiC), and/or the like using a suitable deposition technique such as, but not limited to, advanced patterning film (APF) deposition (which is a form of plasma-enhanced chemical vapor deposition (PECVD)) to provide a mask. The mandrel material may then be etched using a wet or dry chemistry, or be subjected to a CMP process and then recessed using wet or dry chemistry.

For example, in some embodiments, the space between the dummy gates 110, 112 is larger than the space between the fins 102, 104, 106. In these embodiments, a conformal deposition of the mandrel material may be performed so the mandrel material is pinched-off between the fins and not the dummy gates. A wet/dry etch may then be performed to remove the mandrel material between the gates while leaving the mandrel material between the fins. In other embodiments, the mandrel material may be pinched off between the dummy gates. In these embodiments, a CMP process may be performed that stops on top of the dummy gates. A directional recess of the mandrel material may then be performed, where the etch stops at the top of the fin structures. These different processes remove the mandrel material from all surfaces except the spaces formed between exposed portions of the fin structures 102, 104, 106 to form the mandrels 302. The mandrels 302 contact at least the sidewalls of the sacrificial spacers of the fin sacrificial spacers 206, 208, 210 and a top surface of the isolation regions 108. In one embodiment, the top surface of the mandrels 302 do not extend above the top surface of the fin structures 102, 104, 106.

FIGS. 4 to 4B shows that the sacrificial spacers 202, 204 formed on the dummy gates 110, 112 are removed. For example, the nitride liners 214 may be removed using, for example, hot phosphorous. A deglazing process such as HDF may then be used to remove the oxide layer 212. The sacrificial spacers 206, 208, 210 formed on the fin structures 102, 104, 106 are protected by the mandrels 302. FIGS. 5 to 5B show the mandrels 302 having been recessed below a top surface of the fin structures 102, 104, 106 and sacrificial spacers 206, 208, 210 using an etching process such as RIE. In some embodiments, the mandrels 302 are recessed 5 nm to 20 nm.

After the mandrels 302 have been recessed, a protective layer material is deposited on the structure 100 and subsequently etched (e.g., RIE) to form a protective layer 602, 604, as shown in FIGS. 6 to 6B. The protective layer 602, 604 may comprise a material such as comprising such as siliconborocarbonitride (SiCBN), silicon oxycarbonitride (SiOCN), silicon in oxynitride (SiON) and/or the like. The etching process(es) forms a protective layer 602 on and in contact with sidewalls of the remaining sacrificial spacers 206, 208, 210 and the top surface of the recessed mandrels 302. The etching process(es) also forms a protective layer 604 on the sidewalls of each dummy gates 110, 112. In one embodiment, the top surface of the protective layer 602 in contact with the recessed a-C mandrels 302 does not extend above the fin structures 102, 104, 106. Similarly, the top surface of the protective layer 604 on the sidewalls of the dummy gates 110, 112 does not extend above the top surface of the dummy gate hard mask 122, 124.

FIGS. 7 to 7B show that the fin structures 102, 104, 106 are recessed using an etching process such as RIE. In one embodiment, portions of the fin structures 102, 104, 106 no underlying the dummy gates are recessed such that their top surface is co-planar with the isolation regions 108. However, the fin structures 102, 104, 106 may be recessed to other heights as well. The remaining sacrificial spacers 206, 208, 2010 may then be removed from the fin structures 106 using, for example, HFHCL, DHF, hot phosphorous, and/or the like. This process forms trenches 702, 704, 706 that expose sidewalls of the mandrels 302 and sidewalls of the protective layer 602, and further forms a recessed area 708 within each fin between the dummy gates 110, 112.

Sources/drains 802, 804, 806 are then formed, as shown in FIGS. 8 to 8B. In one embodiment, the sources/drains 802, 804, 806 may be formed by epitaxially growing a semiconductor material layer on exposed portions of the fin structures 102, 104, 106. The epi is confined (molded) between sidewalls of the mandrels 302. A larger epi volume is formed for extension, and the protective layer (plug) 602 prevents epi nucleation from occur on top of the mandrels 302. In one embodiment, a top surface of the sources/drains 802, 804, 806 extend above a top surface of the portion of the fin structures 102, 104 shown in the view of FIG. 8A. In addition, FIG. 8B shows the top surface of the sources/drains 802, 804, 806 portions in this view extending above a top surface of the protective layers 602. In one embodiment, the semiconductor material layer of the source/drains 802, 804, 806 are doped in-situ. In other embodiments, an implantation process (i.e., a junction implant process) is performed to dope the sources/drains. In one or more embodiments, each fin structure 102, 104, 106 has its own epi layer (source/drain) 802, 804, 806 having a rectangular shape, as compared to a diamond shape and a continuous block of epi that merges the fins together.

The terms "epitaxially growing", "epitaxial growth", "epitaxially grown", and their variants mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on semiconductor surface, and do not deposit material on dielectric surfaces, such as silicon dioxide or silicon nitride surfaces.

Examples of various epitaxial growth process apparatus that are suitable for use in one or more embodiments include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). A number of different sources can be used for the deposition of the various layers discussed herein. For example, the gas source for the deposition of epitaxial semiconductor material can include a silicon containing gas source, a germanium containing gas source, a carbon containing gas source, or a combination thereof. Examples of silicon containing gas sources are silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane, and combinations thereof. Examples of germanium containing gas sources are germane, digermane, halogermane, dichlorogermane, trichlorogermane, tetrachlorogermane and combinations thereof.

FIGS. 9 to 9B show that a contact etch stop layer (CESL) 902 is formed over the structure 100. In particular, a CESL material such as silicon nitride, carbon doped silicon nitride, and/or the like is deposited on the structure 100 using sputtering, molecular layer deposition (MLD), CVD, high density plasma CVD, sub-atmospheric CVD, and/or the like. A planarization process such as poly open chemical mechanical planarization (POC) is performed to remove the CESL material from horizontal surfaces of the dummy gates 110, 112, and to further remove the bi-layer oxide masks 122, 124 from the dummy gates 110, 112. A portion of the protective layer 604 formed on the dummy gates 110, 112 is removed as well. This process forms a CESL 902 on sidewalls of the protective layers 604 on the dummy gates 110, 112 and a top surface of the sources/drains 802, 804, 806. This process further forms a CESL 902 on a top surface of the protective layers 602 formed on the mandrels 302.

After the CESL 902 is formed, an inter-layer dielectric (ILD) layer 904 is deposited and followed by chemical mechanical planarization (CMP) process. The CMP process stops at the exposed top surface of the CESL 902; protective layers 602, 604; and mandrels 302. The ILD layer 904 may comprise silicon oxide, oxynitride, or other suitable materials. The dummy gates 110, 112 are then selectively removed with respect to the fin structures 102, 104, 106 and the protective layer 604 via selective etching. This creates a trench that exposes a top surface of the etch stop layers 114, 116.

Replacement gates 1002, 1004 are then formed over the channel regions and in contact with the etch stop layers 114, 116, as shown in FIGS. 10 to 10B. In one embodiment, the replacement gates (stacks) 1002, 1004 comprise an optional interfacial layer, an insulating layer, an optional work-function layer, and a gate conductor. The interfacial layer may include but is not limited to, silicon oxide, silicon nitride, silicon oxynitride that can be formed by chemical oxidation, low temperature oxidation, nitridation, and/or oxynitridation process.

The insulating layer is formed by depositing a thin conformal layer over the structure 100 by, for example, CVD, PECVD, or ALD. Excessive insulating layer material is removed, for example, by polishing such as chemically mechanical polishing (CMP) and/or etching to form a horizontal portion of the insulating layer in contact with the horizontal portion of the interfacial layer, and vertical portions in contact with the vertical portions of the interfacial layer and inner sidewalls of the protective layers 604. In one embodiment, the insulating layer may be a high-k dielectric layer. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The insulating layer may further include dopants such as lanthanum or aluminum.

The work-function layer is formed by depositing a thin conformal layer over the structure 100 by, for example, CVD, PECVD, or ALD. Excessive interfacial layer material is removed, for example, by polishing such as chemically mechanical polishing (CMP) and/or etching to form a horizontal portion of the work-function layer in contact with the horizontal portion of the insulating layer, and vertical portions in contact with the vertical portions of the insulating layer. The work-function layer includes one or more metals having a function suitable to tune the work function of finFETs. Examples of first metals that can be employed in the work function metal layer include, but are not limited to TiN, TaN, W, Al-containing alloys. The thickness of the work function metal layers can be from 3 nm to 15 nm, although lesser and greater thicknesses may also be employed.

The gate conductor may be formed, for example, by CVD, PECVD, or ALD and polishing away any excess material. The gate conductor fills the space between the vertical portions of the work-function layer, and contacts the horizontal and vertical portions of the work-function layer. The top surface of the work-function layer is co-planar with the top surface of the insulating layer and the work function metal. In one embodiment, the gate conductor includes, for example, tungsten, aluminum, and/or the like.

FIGS. 10 and 10A also show that a self-aligned contact (SAC) cap 1006, 1008 is formed in contact with the replacement gates 1002, 1004. In one embodiment, the SAC cap 1006 is formed by recessing the gate materials selective to the protective layers 605 such that a top surface of the gate materials is below a top surface of the protective layers 604. The gate materials may be recessed by any suitable isotropic etching such as directional RIE. A layer of SAC cap material such as silicon nitride or carbon-doped silicon nitride is then deposited over the semiconductor structure 100 and within the recessed top of the gate structure. The SAC cap material is planarized down to self-align the SAC caps 1006 to the edges of the protective layers 604.

The ILD layer 904 is then removed selective to the CESL 902 utilizing an etching process such as RIE, as shown in FIGS. 11 to 11B. This processes exposes the CESL 902. FIGS. 12 to 12B show that a selective etch is performed to remove portions of the CESL 902 on horizontal surfaces of the structure 100. The CESL 902 on vertical surfaces such as the vertical sidewalls of the protective layers 604 on the gates 1102, 1104 is not removed. FIG. 12B further shows that the CESL 902 and protective layers 606 are removed selective to the sources/drains 802, 804, 806 and the mandrels 302.

FIGS. 13 to 13B show that the mandrels 302 are removed selective to the sources/drains 802, 804, 806 and the isolation regions 108 using a selective etch process. This process creates trenches 1302 to 1308 adjacent to and between portions of the sources/drains 802, 804, 806, as shown in FIG. 13B. The trenches 1302 to 1308 expose sidewalls of the sources/drains 802, 804, 806 and a top surface of the isolation regions 108. FIGS. 14 to 14B show that a conformal layer 1402, 1404 comprising a conductive material is then deposited on the structure. The portion of the conformal layer 1402 shown in FIG. 14A is formed on and in contract with a top surface of the sources/drains 804 and a portion of the sidewalls of the protective layer (side spacer) 604.

The portion of the conformal layer 1404 shown in FIG. 14B fills the trenches 1302 to 1308, and is formed on and in contact with a top surface and sidewalls of the sources/drains 802, 804, 806 and top surface of the isolation regions 108. The conformal layer 1402, 1404 may be referred to as a "wrap-around contact" because it wraps around the top and sides of the sources/drains 802, 804, 806. Since layer 1402, 1404 forms a wrap around contact and silicide at the top and along the sidewalls of the source and drain epitaxial layers the contact area is increased and the contact resistance is decreased. The conformal layer 1402, 1404 may be formed using a process such as CVD, PVD, ALD, or electroplating processes or some combination of these processes. The conductive metal may include, but is not limited to, titanium, cobalt, tungsten, copper, aluminum, silver, gold and alloys thereof. In some embodiments, an overfill process may be performed utilizing the same or different conductive material as the conformal layer 1402, 1404.

It should be noted that although the embodiments discussed above were directed to finsFET devices, these embodiments are also applicable to gate-all-around devices such as nanosheet devices. FIGS. 15 to 15B show one example of an initial structure 1500 for forming a gate-all-around device(s) according to one or more embodiments. In this example, one or more fin structure 1502, 1504, 1506 are shown, where one or more dummy gates 1518, 1520 have been formed on a portion of the fin structures 1502, 1504, 1506. In one embodiment, the dummy gates 1518, 1520 are similar to those discussed above with respect to FIGS. 1 to 1B.

The fin structures 1502, 1504, 1506 may comprise a handle substrate 1508, and a stack 1510 of alternating first semiconductor material and a second semiconductor material. The handle substrate 1508, in one embodiment, comprises a semiconductor material, an insulator material, a conductive material, or a combination thereof. The thickness of the handle substrate 1508, in one embodiment, may range from 50 microns to 2 mm, although lesser and greater thicknesses can also be employed.

In embodiment, the stack 1510 may comprise at least one first semiconductor material layer 1512 (sacrificial layer) and at least one second semiconductor material layer 1514 (channel layer). The stack 1510 may include a plurality of first semiconductor material layers 1512 and a plurality of second semiconductor material layers 1514. As used herein, a "semiconductor material" refers to a material having a conductivity in a range from $3.0 \times 10^{-4}$ Ohm-cm to $3.0 \times 10^{3}$ Ohm-cm, and includes an intrinsic semiconductor material, a p-doped semiconductor material, an n-doped semiconductor material, or a combination of semiconductor materials having different types of doping. The first semiconductor material layers 1512 comprise a first semiconductor material that can be removed selective to the second semiconductor material of the second semiconductor material layers 1514. Each of the at least one first semiconductor material layers 1512 and the second semiconductor material layers 1514 can be single crystalline. In one embodiment, the entirety of the stack 1510 is single crystalline.

In one embodiment, the first semiconductor material layers 1512 may comprise a silicon-containing semiconductor material in which the atomic concentration of silicon is greater than 80%, and the second semiconductor material layers 1514 include a germanium-containing semiconductor material in which the atomic concentration of germanium is greater than 20%. For example, the first semiconductor material layers 1512 can include single crystalline silicon or a single crystalline silicon-germanium alloy in which the atomic concentration of germanium is less than 20%.

In another embodiment, the first semiconductor material layers 1512 comprise a first single crystalline compound semiconductor material, and the second semiconductor material layers 1514 comprise a second single crystalline compound semiconductor material that can be removed selective to the first single crystalline compound semiconductor material. For example, the first semiconductor material layers 1512 comprise silicon-germanium (SiGe), and the second semiconductor material layers 1514 comprise silicon. In one embodiment, each of the first semiconductor material layers 1512 is deposited as a single crystalline semiconductor material layer in epitaxial alignment with an underlying material layer. In one embodiment, each of the second semiconductor material layers 1514 is deposited as a single crystalline material layer in epitaxial alignment with an underlying material layer.

The thicknesses of the first semiconductor material layers 1512 and the second semiconductor material layers 1514 are selected such that the entirety of the epitaxial alignment of the first semiconductor material layers 1512 and the second semiconductor material layers 1514 can be maintained throughout the entirety of the stack. Thus, the thickness of each of the first semiconductor material layers 1512 and the second semiconductor material layers 1514 is less than the corresponding critical thickness, which is the thickness at which an epitaxial material begins to lose epitaxial registry with the underlying single crystalline layer by developing dislocations. For example, the thickness of each of the first semiconductor material layers 1512 and the second semiconductor material layers 1514 is in a range from 3 nm to 60 nm, although lesser and greater thicknesses can also be employed.

In some embodiments, the stack 1510 is formed by a series of epitaxial growth processes. The terms "epitaxial growth", "epitaxial deposition", "epitaxially formed", "epitaxially grown", and their variants and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on semiconductor surface, and do not deposit material on dielectric surfaces, such as silicon dioxide or silicon nitride surfaces.

In one embodiment, the number of repetitions for a pair of a first semiconductor material layer 1512 and a second semiconductor material layer 1514 is 2 or greater. In one embodiment, the number of repetitions for a pair of a first semiconductor material layer 1512 and a second semiconductor material layer 1514 is in a range from, and including, 2 to, and including, 100. The stack 1510, in one embodiment, begins, at the bottom, with a first semiconductor material layer 1512 or with a second semiconductor material layer 1514. In one embodiment, the stack terminates, at the top, with a first semiconductor material layer 1512 or with a second semiconductor material layer 1514. In one embodiment, the stack 1510 may be referred to as a nanosheet stack.

The stack 1510 of the first semiconductor material layers 1512 and the second semiconductor material layers 1514 are patterned to form the one or more alternating vertical stacks 1510 of alternating first and second semiconductor material layers 1512, 1514. For example, a photoresist layer (not shown) can be applied over the second semiconductor material layer 1514 (or an optional cap layer if formed) and lithographically patterned to cover a contiguous area. The shape of the contiguous area covered by the patterned photoresist layer can be selected to include an elongated region having a same width and two end portions having a greater width than the elongated region. The pattern in the photoresist layer can be transferred through the alternating stack by an anisotropic etch. A remaining portion of the stack of the first semiconductor material layers 1512 and the second semiconductor material layers 1514 constitute the alternating stack(s) 1510 of the first semiconductor material portions 1512 and the second semiconductor material portions 1514. In one embodiment, the entirety of the alternating stack(s) 1510 may be single crystalline. Besides the lithography patterning, other patterning techniques such as sidewall imaging transfer, multiple patterning, or the combination of those techniques can be used to pattern the stack 1510.

In one embodiment, each of the first semiconductor material layers 1512 and the second semiconductor material layers 1514 has a uniform width in a range from 10 nm to 100 nm. The first semiconductor material layers 1512 and the second semiconductor material layers 1514, in one embodiment, have sidewalls that are vertically coincident among one another. As used herein, surfaces are "vertically coincident" if the surfaces are located within a same vertical plane. In one embodiment, first semiconductor material layers 1512 and the second semiconductor material layers 1514 have a same horizontal cross-sectional shape. The first semiconductor material layers 1512 and the second semiconductor material layers 1514 may be semiconductor material fin structures and second semiconductor material fin structures, respectively. As used herein, a "fin" refers to a structure having a pair of vertical sidewalls and a uniform width between the pair of vertical sidewalls that is invariant under translation along the direction of the vertical sidewalls. The alternating stack(s) 1510 of the first semiconductor material layers 1512 and the second semiconductor material layers 1514 constitutes a semiconductor fin having a pair of parallel sidewalls that extend along a lengthwise direction and having a uniform width throughout. As used herein, a "lengthwise direction" is a horizontal direction around which an axis passing through a center of mass of an element would have the least moment of inertia. The alternating vertical stacks 1510, in some embodiments, may be referred to nanosheet fin structures.

In one embodiment, the first semiconductor material layers 1512 and the second semiconductor material layers 1514 are single crystalline and epitaxially aligned among one another. Further, the first semiconductor material layers 1512 and the second semiconductor material layers 1514, in on embodiment, have different lattice constants. In this case, the first semiconductor material layers 1512 and the second semiconductor material layers 1514 may be in opposite types of stress along horizontal directions. If an optional cap layer is employed, it may be removed once the alternating stack(s) 1510 of the first semiconductor material layers 1512 and the second semiconductor material layers 1514 is formed, for example, by a wet etch that removes the material of the cap layer selective to the substrate 1502 and the alternating stack 1510 of the first semiconductor material layers 1512 and the second semiconductor material layers 1514. In some embodiments, isolation regions 1516 are formed between the fin structures 1502, 1504, 1506 similar to the process discussed above with respect to FIGS. 1 to 1B.

After one or more fin structures 1502, 1504, 1506 have been formed, processes similar to those discussed above with respect to FIGS. 2 to 7B are performed. Then, after the fin structures 1502, 1504, 1506 have been recessed, an inner spacer formation process is performed. For example, FIGS. 16 to 16B show the semiconductor structure after the mandrel layer(s) 1602 and protective layer(s) 1604, 1606 have been formed, and after the fin structures 1502, 1504, 1506 have been recessed. FIGS. 16 to 16B also show that a portion of the first semiconductor material layers 1512 may be removed to reduce the size of the first semiconductor material layers 1512 in at least one lateral dimension (i.e., length, width). The portion of the first semiconductor material layers 1512 may be removed using an isotropic etch (e.g., wet chemical etch, non-directional dry plasma etch, etc.), where the isotropic etch etches laterally into the first semiconductor material layers 1512. The isotropic etch may remove a predetermined amount of material from the first semiconductor material layers 1512, where the etch may be a timed etch to uniformly remove an equal amount of material from each exposed end.

The isotropic etch may form indentations 1608 having a predetermined indentation depth into the first semiconductor material layers 1512. After a the etching process, the second semiconductor material layers 1514 may extend passed the first semiconductor material layers 1512 by a predetermined distance. Each of the indentations 1608 may extend into the area below the protective layer (side spacer) 1606 comprising, for example, SiCBN in contact with the dummy gate(s) 1518, 1520. In one or more embodiments, the indentations 1608 align with the protective layer 1606.

FIGS. 17 to 17B show that an inner spacer layer(s) 1702 may be formed on one or more first semiconductor material layers 1512 and one or more second semiconductor material layers 1514 of each fin structure 1502, 1504, 1506; where the inner spacer layer 1702, 1704 may fill the indentations 1608 adjacent to the remaining portion of the first semiconductor material layers 1512, and between overhanging first semiconductor material layers 1512. The inner spacer layer 1702 may be formed on at least a portion of the substrate 1508 and dummy gate(s) 1518, 1520, and may be etched back by the RIE or wet to leave the inner spacer layer 1702 in the indentations 1608. The inner spacer layer(s) 1702 contacts at least sidewalls of the indented first semiconductor material layers 1512 and a portion of the bottom surface of the second semiconductor material layers 1514 of the fin structures 1502, 1504, 1506.

The inner spacer layer 1702 may be formed by ALD, PEALD, CVD, PECVD, or combinations thereof, where the inner spacer layer 1702 may be conformally deposited within the indentations 1608 (e.g., by ALD) to fill the indentations. Portions of the inner spacer layer 1702 that extend out beyond the side spacers 1604 of the dummy gates 1518, 1520 may be removed by a directional etch (e.g., RIE). In one or more embodiments, the inner spacer layer 1702 may be a silicon nitride (SiN), a silicon oxide (SiO), silicon oxynitride (SiON), silicon oxycarbide (SiOC), a silicon boro carbonitride (SiBCN), a silicon oxy carbonitride (SiOCN), a silicon carbide (SiC), a high-k metal oxide, a low-k insulator, or suitable combinations thereof.

After the inner spacer layer 1702 has been formed, processes similar to those discussed above with respect to FIGS. 8 to 14B are performed resulting in the structure shown in FIGS. 18 to 18B. For example, FIGS. 18 to 18B show that sources/drains 1802, 1804, 1806 have been epitaxially grown; replacement gate stacks 1808, 1810 have been formed; and a contact etch stop layer 1822 has been formed similar to those features discussed above with respect to FIGS. 8 to 13B. The replacement gate stacks 1808, 1810 are formed by first removing the dummy gates 1518, 1520 using a process similar to that discussed above with respect to FIGS. 9 to 9B. The first semiconductor material layers 1512 are then removed using an isotropic etch, for example, a wet etch selective for the material of the layers 1512.

In one embodiment, a gate dielectric layer 1812, 1814 is formed on the exposed surfaces of the second semiconductor material layers 1514 where the gate dielectric layer 1812, 1814 may be formed by a conformal deposition process, for example, ALD, CVD, or combinations thereof. The gate dielectric layer 1812, 1814 may be an insulating dielectric layer, for example, a silicon oxide (SiO), silicon nitride (SiN), silicon oxynitride (SiON), a high-K dielectric, or a suitable combination of these materials. In various embodiments, the gate dielectric layer 1812, 1814 may be a high-K dielectric material that can include, but is not limited to, transition metal oxides such as hafnium oxide (e.g., $HfO_2$), hafnium silicon oxide (e.g., $HfSiO_4$), hafnium silicon oxynitride ($Hf_wSi_xO_yN_z$), lanthanum oxide (e.g., $La_2O_3$), lanthanum aluminum oxide (e.g., $LaAlO_3$), zirconium oxide (e.g., $ZrO_2$), zirconium silicon oxide (e.g., $ZrSiO_4$), zirconium silicon oxynitride ($Zr_wSi_xO_yN_z$), tantalum oxide (e.g., $TaO_2$, $Ta_2O_5$), titanium oxide (e.g., $TiO_2$), barium strontium titanium oxide (e.g., $BaTiO_3$—$SrTiO_3$), barium titanium oxide (e.g., $BaTiO_3$), strontium titanium oxide (e.g., $SrTiO_3$), yttrium oxide (e.g., $Y_2O_3$), aluminum oxide (e.g., $Al_2O_3$), lead scandium tantalum oxide ($Pb(Sc_xTa_{1-x})O_3$), and lead zinc niobate (e.g., $PbZn_{1/3}Nb_{2/3}O_3$). The high-k material can further include dopants such as lanthanum and/or aluminum. The stoichiometry of the high-K compounds can vary.

In one or more embodiments, a conductive gate electrode 1816, 1818 is formed in contact with the gate dielectric layer 1812, 1814. The conductive gate electrode 1816, 1818 and the gate dielectric layer 1812, 1814 may surround at least a portion of the second semiconductor material layers 1514.

The conductive gate electrode 1816, 1818 may comprise a work function layer and a gate fill layer. The work function layer may be formed on the exposed portion(s) of the gate dielectric layer 1812, 1814 between the second semiconductor material layers 1514. The work function layer may be formed on the gate dielectric layer 1812, 1814 to adjust the electrical properties of a gate electrode. In various embodiments, the work function layer can be optional. In one or more embodiments, the work function layer may fill in the spaces between the gate dielectric layers 1812, 1814 on the second semiconductor material layers 1514. The work function layer may be formed by a conformal deposition, for example, ALD.

In various embodiments, a work function layer may be a conductive nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a conductive carbide, including but not limited to titanium carbide (TiC), titanium aluminum carbide (TiAlC), tantalum carbide (TaC), hafnium carbide (HfC); or combinations thereof. The work function layer can include multiple layers of work function materials, for example, a work function layer can be a TiN/TiC stack. In various embodiments, the work function layer may have a thickness in the range of about 3 nm to about 11 nm, or can have a thickness in the range of about 5 nm to about 8 nm.

The gate fill layer may be formed on the gate dielectric layer 1812, 1814 and/or work function layer if present. The gate fill layer, gate dielectric layer 1812, 1814, and optionally the work function layer can form a gate structure on one or more the second semiconductor material layers 1514, where the gate fill layer and work function layer form the conductive gate electrode 1816, 1818. In various embodiments, the gate fill layer may be blanket deposited on the exposed surfaces of the gate dielectric layer 1812, 1814 and/or work function layer. In one or more embodiments, the gate fill layer may be a conductive metal, where the metal can be tungsten (W), titanium (Ti), molybdenum (Mo), cobalt (Co), or a conductive carbon material (e.g., carbon nanotube, graphene, etc.), or any suitable combinations thereof.

FIGS. 18 to 18B further show that a conformal layer 1820 comprising a conductive material is then deposited on the structure. The portion of the conformal layer 1820 shown in FIG. 18A is formed on and in contract with a top surface of the sources/drains 1804 and a portion of the sidewalls of the protective layer (side spacer) 1606. The portion of the conformal layer 1820 shown in FIG. 18B is formed on and in contact with a top surface and sidewalls of the sources/drains 1802, 1804, 1806 and top surface of the isolation regions 1516. The conformal layer 1820 may be referred to as a "wrap-around contact" because it wraps around the top and sides of the sources/drains 1802, 1804, 1806. Since layer 1820 forms a wrap around contact and silicide at the top and along the sidewalls of the source and drain epitaxial layers the contact area is increased and the contact resistance is decreased. The conformal layer 1820 may be formed using a process such as CVD, PVD, ALD, or electroplating processes or some combination of these processes. The conductive metal may include, but is not limited to, titanium, cobalt, tungsten, copper, aluminum, silver, gold and alloys thereof. In some embodiments, an overfill process may be performed utilizing the same or different conductive material as the conformal layer 1820.

Figure 19:
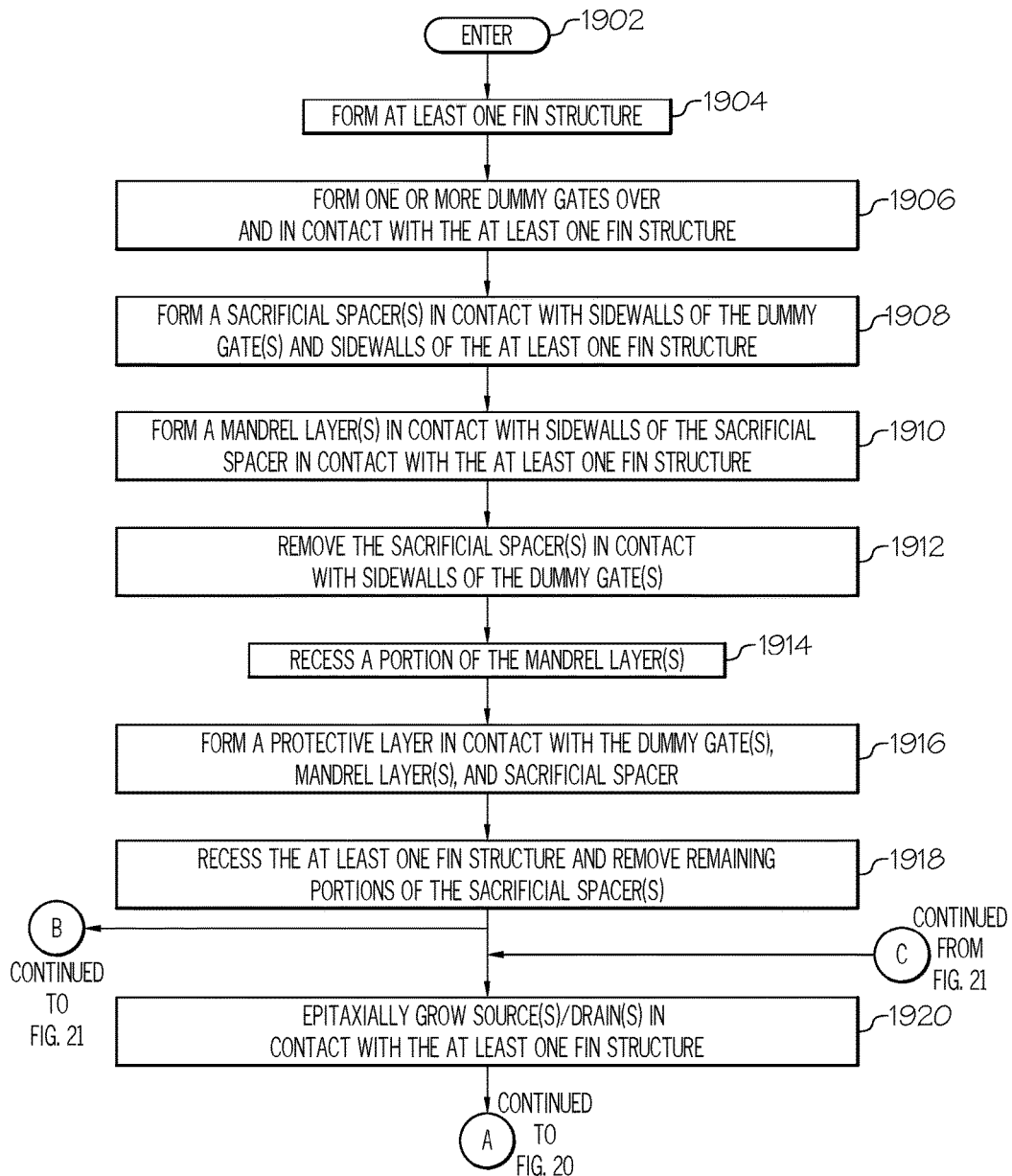
FIGS. 19 and 20 are operational flow diagrams illustrating one process for forming wrap-around contacts using a sacrificial mandrel layer according one embodiment of the present disclosure.

FIG. 19 is an operational flow diagram illustrating a process for fabricating a semiconductor structure comprising one or more wrap-around contacts. In FIG. 19, the operational flow diagram begins at step 1902 and flows directly to step 1904. It should be noted that each of the steps shown in FIG. 19 has been discussed in greater detail above with respect to FIGS. 1-18B. At least one fin structure, at step 1904, is formed. The fin structure may be formed from a bulk substrate, an SOI substrate, a nanosheet stack, and/or the like. One or more dummy gates, at step 1906, are formed over and in contact with a portion of the at least one fin structure. A sacrificial spacer, at step 1908, is formed in contact with sidewalls of the dummy gate(s) and sidewalls of the at least one fin structure.

A mandrel layer, at step 1910, is formed in contact with sidewalls of the sacrificial spacer. The sacrificial spacer(s) in contact with sidewalls of the dummy gate(s), at step 1912, are then removed. A portion of the mandrel layer(s), at step 1914, is recessed such that a top surface of the mandrel layer(s) is below a top surface of the sacrificial spacer and a top surface of the at least one fin structure.

Figure 20:
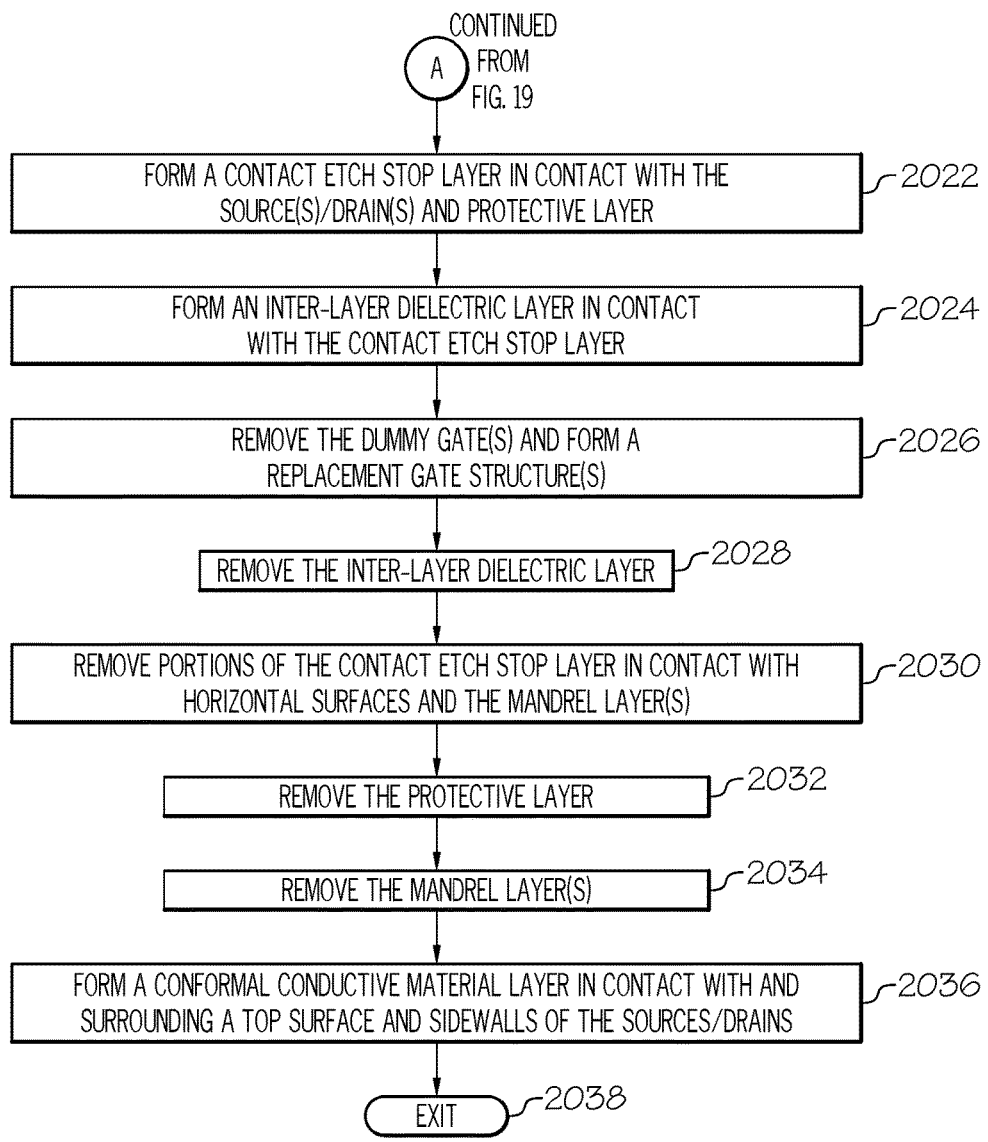

A protective layer, at step 1916, is formed on and in contact with the sidewalls of the dummy gate(s), a top surface of the mandrel layer(s), and a portion of the sidewalls of the sacrificial spacer. The at least one fin structure, at step 1918, is then recessed and the remaining portions of the sacrificial spacer are removed. Sources/Drains, at step 1920, are epitaxially grown in contact with a top surface of the recessed portion of the at least one fin structure, sidewalls of the mandrel layer(s), sidewalls of the protective layer(s), and sidewalls of the portions of the at least one fin structure under the dummy gate(s). Control flow continues to entry point A of FIG. 20.

A conformal contact etch stop layer, at step 2022, is formed over the structure and removed from the top surface of the dummy gate(s) and top surface of the protective layer formed on the sidewalls of the dummy gate(s). An inter-layer dialectic layer, at step 2024, is formed in contact with the contact etch stop layer. The dummy gate(s), at step 2026, is removed and a replacement gate(s) is formed in contact with inner sidewalls of the protective layer previously in contact with the dummy gate(s). The inter-layer dialectic layer, at step 2028, is then removed. Portions of the contact etch stop layer in contact with horizontal surfaces and the mandrel layer(s), at step 2030, are removed. The protective layer, at step 2032, is removed. The mandrel layer(s), at step, 2034 is then removed. A conformal conductive material layer, at step 2036, is then formed in contact with and surrounding a top surface and sidewalls of the sources/drains. The control flow exits at step 2038.

Figure 21:
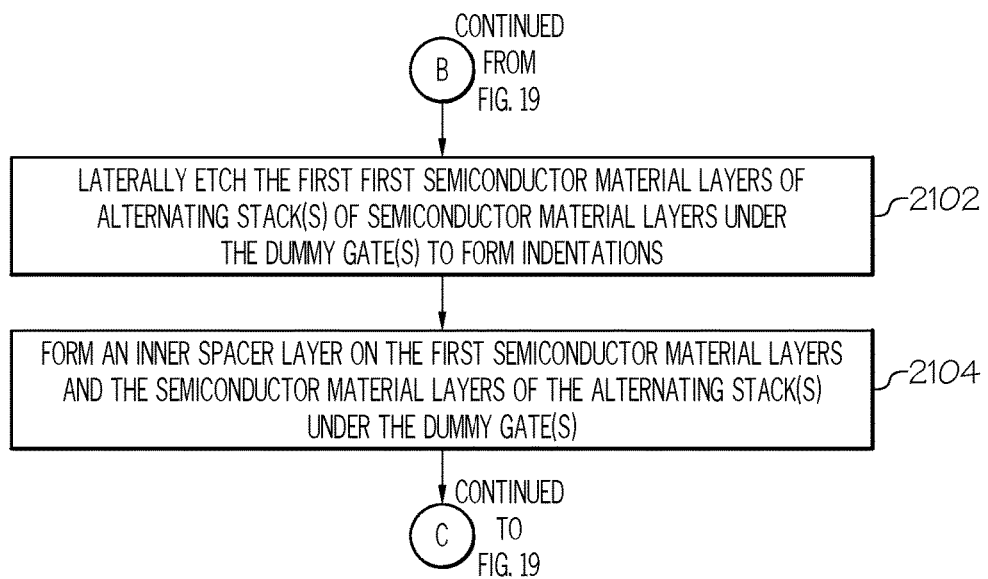
FIG. 21 is an operational flow diagram illustrating processing operations in addition to those of FIGS. 19 and 20 for forming wrap-around contacts using a sacrificial mandrel layer for a gate all around device according one embodiment of the present disclosure.

FIG. 21 is an operational flow diagram illustrating a process for fabricating a gate all around device such as a nanosheet device comprising one or more wrap-around contacts. In FIG. 21, the operational flow diagram begins after the fin structure has been recess and the sacrificial spacer has been removed in block 1918 of FIG. 19. It should be noted that each of the steps shown in FIG. 21 has been discussed in greater detail above with respect to FIGS. 15 to 18B. The first semiconductor material layers of the alternating stack(s) under the dummy gate(s), at step 2102, are laterally etched to form indentations. An inner spacer layer, at step 2104, is formed on the first semiconductor material layers and the semiconductor material layers of the alternating stack(s) under the dummy gate(s). The inner spacer layer(s) contacts at least sidewalls of the indented first semiconductor material layers and a portion of the bottom surface of the second semiconductor material layers. The control flow then continues to entry point C of FIG. 19.

Although specific embodiments have been disclosed, those having ordinary skill in the art will understand that changes can be made to the specific embodiments without departing from the spirit and scope of the disclosure. The scope of the disclosure is not to be restricted, therefore, to the specific embodiments, and it is intended that the appended claims cover any and all such applications, modifications, and embodiments within the scope of the present disclosure.

It should be noted that some features of the present disclosure may be used in one embodiment thereof without use of other features of the present disclosure. As such, the foregoing description should be considered as merely illustrative of the principles, teachings, examples, and exemplary embodiments of the present disclosure, and not a limitation thereof.

Also note that these embodiments are only examples of the many advantageous uses of the innovative teachings herein. In general, statements made in the specification of the present application do not necessarily limit any of the various claimed disclosures. Moreover, some statements may apply to some inventive features but not to others.

What is claimed is:

1. A method for forming a semiconductor structure, the method comprising at least:
   forming at least one mandrel layer adjacent to at least one fin structure;
   recessing the at least one fin structure;
   epitaxially growing at least one source/drain in contact with the at least one fin structure and the at least one mandrel layer;
   removing the at least one mandrel layer after the at least one source/drain has been epitaxially grown; and
   forming at least one contact layer in contact with sidewalls and a top surface of the at least one source/drain.

2. The method of claim 1, further comprising:
   forming at least one spacer in contact with sidewalls of the at least one fin structure prior to forming the at least one mandrel layer.

3. The method of claim 2, wherein forming the at least one spacer comprises:
   forming a first spacer layer in contact with sidewalls of the at least one fin structure; and
   forming a second spacer layer in contact with the first spacer layer.

4. The method of claim 2, wherein forming the at least one mandrel layer comprises:
   forming the at least one mandrel layer in contact with the at least one spacer.

5. The method of claim 2, further comprising:
   removing the at least one spacer after the at least one fin structure has been recessed and prior to epitaxially growing the at least one source/drain.

6. The method of claim 1, further comprising:
   recessing the at least one mandrel layer below a top surface of the at least one fin structure prior to recessing the at least one fin structure.

7. The method of claim 5, further comprising:
   forming at least one protective layer at least in contact with a top surface of the at least one mandrel layer.

8. The method of claim 1, further comprising:
   forming at least one dummy gate on a portion of the at least one fin structure.

9. The method of claim 8, further comprising:
forming at least one protective layer at least in contact with a top surface of the at least one mandrel layer, and in contact with sidewalls of the at least one dummy gate.

10. The method of claim 9, further comprising:
forming a contact etch stop layer in contact with a top surface of the at least one source/drain, sidewalls of a portion of the protective layer formed in contact with sidewalls of the at least one dummy gate, and a top surface of a portion of the protective layer formed at least in contact with the top surface of the at least one mandrel layer; and
forming an inter-layer dielectric layer in contact with a top surface and sidewalls of the protective layer.

11. The method of claim 10, wherein after the inter-layer dielectric layer is formed:
removing the at least one dummy gate, wherein the removing exposes inner sidewalls of the protective layer; and
forming a replacement gate at least in contact with the inner sidewalls of the protective layer.

12. The method of claim 11, further comprising:
removing the inter-layer dielectric layer; and
removing horizontal portions of the contact etch stop layer.

13. The method of claim 1, further comprising:
forming the at least one fin structure from a single semiconductor layer material.

14. The method of claim 1, further comprising:
forming the at least one fin structure from an alternating stack of semiconductor material layers.

15. A semiconductor structure comprising at least:
a plurality of unmerged fin structures;
a separate source/drain in contact with each unmerged fin structure of the plurality of unmerged fin structures, wherein the source/drain comprises a rectangular shape; and
a contact layer formed on sidewalls and a top surface of each source/drain.

16. The semiconductor structure of claim 15, further comprising:
a plurality of gate structures, wherein each gate structure is formed on a portion of an unmerged fin structure of the plurality of unmerged fin structures.

17. The semiconductor structure of claim 15, wherein each unmerged fin structure of the plurality of unmerged fin structures is formed from a single semiconductor material layer.

18. The semiconductor structure of claim 15, wherein each unmerged fin structure of the plurality of unmerged fin structures is formed from an alternating stack of semiconductor material layers.

19. An integrated circuit comprising:
one or more semiconductor devices, wherein at least one of the one or more semiconductor devices comprises at least:
a plurality of unmerged fin structures;
a separate source/drain in contact with each unmerged fin structure of the plurality of unmerged fin structures, wherein the source/drain comprises a rectangular shape; and
a contact layer formed on sidewalls and a top surface of each source/drain.

* * * * *